(12) United States Patent
Yamaguchi et al.

(10) Patent No.: US 7,528,880 B2
(45) Date of Patent: May 5, 2009

(54) IMAGE PICKUP DEVICE AND IMAGE PICKUP LENS

(75) Inventors: Susumu Yamaguchi, Hachioji (JP); Hiroyuki Hattori, Hachioji (JP); Kazuo Tansho, Hachioji (JP); Yasushi Hoshino, Hachioji (JP); Yuichi Honda, Hachioji (JP)

(73) Assignee: Konica Corporation, Tokyo (JP)

( * ) Notice: Subject to any disclaimer, the term of this patent is extended or adjusted under 35 U.S.C. 154(b) by 615 days.

(21) Appl. No.: 10/040,437

(22) Filed: Jan. 9, 2002

(65) Prior Publication Data
US 2002/0131782 A1 Sep. 19, 2002

(30) Foreign Application Priority Data

| Jan. 12, 2001 | (JP) | ............................. 2001-004706 |
| Feb. 9, 2001 | (JP) | ............................. 2001-033111 |
| May 18, 2001 | (JP) | ............................. 2001-148912 |
| May 24, 2001 | (JP) | ............................. 2001-155083 |

(51) Int. Cl.
*G02B 13/16* (2006.01)
*H04N 5/225* (2006.01)

(52) U.S. Cl. ...................................... 348/335; 348/340
(58) Field of Classification Search ................. 348/335, 348/340, 373, 374, 376
See application file for complete search history.

(56) References Cited

U.S. PATENT DOCUMENTS

| 4,451,124 | A | * | 5/1984 | Basista et al. ................ 359/687 |
| 4,896,217 | A | * | 1/1990 | Miyazawa et al. ........... 348/340 |
| 5,040,069 | A | * | 8/1991 | Matsumoto et al. ........... 348/76 |
| 5,274,456 | A | | 12/1993 | Izumi et al. |
| 5,400,072 | A | * | 3/1995 | Izumi et al. .................. 348/335 |
| 5,783,815 | A | * | 7/1998 | Ikeda ....................... 250/208.1 |
| 6,122,009 | A | * | 9/2000 | Ueda ........................... 348/335 |
| 2001/0012073 | A1 | * | 8/2001 | Toyoda et al. ............... 348/335 |
| 2003/0137595 | A1 | * | 7/2003 | Takachi ....................... 348/340 |

FOREIGN PATENT DOCUMENTS

EP 0585186 A2 3/1994

(Continued)

OTHER PUBLICATIONS

European Search Report—Application No. 04010162.8, Konica Minolta Opto, Inc., dated Sep. 30, 2005.

*Primary Examiner*—Sinh Tran
*Assistant Examiner*—Yogesh Aggarwal
(74) *Attorney, Agent, or Firm*—Finnegan, Henderson, Farabow, Garrett & Dunner, L.L.P.

(57) ABSTRACT

An image pickup device provided on a base board, comprises an image pickup element provided on the base board and including a photoelectrically converting section in which pixels are arranged, a peripheral surface formed around the photoelectrically converting section and a side surface crossing the peripheral surface; an optical member including a lens section to form an image of an object onto the photoelectrically converting section of the image pickup element, a leg section to support the lens section and a contact surface to be brought in contact with the image pickup element, wherein the lens section, the leg section and the contact surface are made in a single body. The optical member is mounted on the image pickup element such that the contact surface is brought in contact with the peripheral surface or with a surface member when the surface member is provided on the peripheral surface.

22 Claims, 17 Drawing Sheets

FOREIGN PATENT DOCUMENTS

| | | |
|---|---|---|
| EP | 0 773 673 A1 | 5/1997 |
| EP | 0773673 A1 | 5/1997 |
| JP | 61134187 | 6/1986 |
| JP | 09312809 | 2/1997 |
| JP | 09121040 | 5/1997 |
| JP | 09-284617 | 10/1997 |
| JP | 09312808 A * | 12/1997 |

* cited by examiner

PRIOR ART

IMAGE PICKUP DEVICE AND IMAGE PICKUP LENS

BACKGROUND OF THE INVENTION

The present invention relates to an image pickup device, and more particularly, to an image pickup device capable of being mounted on a cell phone and a personal computer.

In recent years, highly efficient CPUs, advanced image processing technologies and others have made it possible to handle digital image data easily. In the field of a cell phone and PDA, in particular, a type that is equipped with a display capable of displaying an image has appeared on the market, and rapid progress in radio-communication speed is expected in the near future, which makes us to estimate that transmission of image data will be conducted frequently between these cell phones and PDAs.

Incidentally, under the existing circumstances, these image data are transmitted through internet by a personal computer, after object images have been converted into image data by a digital still camera. In the mode of this kind, however, both a digital still camera and a personal computer need to be provided for transmitting image data. In contrast to this, there is an attempt to mount an image pickup element such as CCD type image sensor on a cell phone. An attempt of this kind makes it unnecessary to have a digital still camera and a personal computer, and it makes it possible for a cell phone that can be carried conveniently to pick up images and to send them to a partner.

However, if a cell phone is made to have functions owned by a digital still camera which is far greater than the cell phone at this stage, the cell phone itself grows greater in size and becomes heavier, resulting in a problem that it cannot be carried conveniently. Further, manufacturing cost for the cell phone is also increased by an amount equivalent to the increase in its size and weight.

In particular, even when a photographing optical system and an image pickup element which are primary constituent factors of the digital camera are unitized, a photoelectrically-converting section of the image pickup element is required to be set appropriately on the focusing position of the photographing optical system, and how to adjust them results in a problem.

For example, when the image pickup element and the photographing optical system are installed on the same base board, it is considered to be difficult to incorporate a photo-electrically-converting section of a photographing element accurately on the focusing position of the photographing optical system, because of factors such as dispersion of a thickness of adhesive agents to be used for the aforesaid installation on the base board and dimensional dispersion of constituent parts. Therefore, for enhancing the focusing position of the photographing optical system and accuracy of incorporating a photoelectrically-converting section of a image pickup element, highly accurate incorporating technology is required, or a mechanism to adjust the focusing position separately is needed, which causes a problem of an increase of manufacture cost. Problems in prior art will be pointed out, referring to the examples.

FIG. 6 is a sectional view showing an example of an image pickup device in the prior art, wherein image pickup element 110 is arranged on base board PC made of glass epoxy resin, and the image pickup element 110 is connected with image processing IC circuit 111 arranged on the reverse side of the base board PC through many wires W coming from a terminal (not shown) on the upper surface of the image pickup element 110.

First housing 101 is arranged to cover the image pickup element 110, and second housing 102 is placed on the first housing 101 so that both of them are fixed together to the base board with bolts 103. Infrared absorption filter 104 is arranged between the first housing 101 and the second housing 102.

An upper portion of the second housing 102 is in a cylindrical form, and lens-barrel 105 housing therein lens 106 is mounted on the second housing 102, through engagement between female screw 102a formed inside the cylindrical upper portion and male screw 105a formed on the lens-barrel 105, to be adjustable in terms of a position in the direction of an optical axis. The lens-barrel 105 is provided with diaphragm portion 105b that is formed on the upper portion of the lens-barrel 105.

As stated above, the image pickup device in the prior art is a relatively-large device composed of many parts. Therefore, it naturally has a problem of the aforesaid manufacturing cost, and assembling of the parts is time-consuming, while in the course of construction, it is necessary to adjust relative positions between the image pickup element 110 and the lens 106 by rotating the lens-barrel 105. For these problems, TOK-KAIHEI No. 9-284617, for example, discloses an image pickup device wherein an image pickup element and an optical system are unitized.

In the image pickup device mentioned above, the number of parts is reduced by the unitization and the device is made to be compact accordingly, which makes it easy to mount the device on a cell phone. Incidentally, the image pickup device of this kind is of a structure wherein four corners of the so-called bare chip representing an image pickup element itself are used for positioning in the direction of an optical axis of a lens and for positioning in the direction perpendicular to the optical axis of the lens, and thereby, a focused image is formed at an appropriate position on a photoelectrically-converting section of the bare chip. However, four corner edges of the bare chip are actually poor in terms of surface accuracy such as flatness and roughness if no action is taken, because each of them is usually a silicone wafer having a thickness of about 0.5 mm which is simply cut. Accordingly, for improving positioning accuracy while using four corner edges of the bare chip, a holding portion for a lens section needs to be extended along each surface to be as long as possible from each of four corners of the bare chip, which causes a problem that the structure is made to be large in size. When wire bonding pads to be connected with a base board are arranged on the surface of the bare chip closer to the lens, in particular, these pads must be avoided, which makes the design of the holding portion to be difficult.

Further, for solving the problems stated above, there is an attempt to construct an image pickup device by providing on a lens a leg portion which is extended to the vicinity of a focal length position of the lens and thereby by making the leg portion to touch an image pickup element directly. The attempt of this kind makes it possible to arrange a photoelectrically-converting section of the image pickup element at the focusing position of the lens, and thereby, to reduce the time to incorporate the image pickup device greatly.

However, in various apparatuses each being equipped with the compact image pickup device of this kind, it is supposed that the image pickup device is vibrated or it is dropped accidentally and is shocked. In these cases, if the leg portion of the lens is in contact with the image pickup element, there is a fear that the lens is loosened by the vibration or the image pickup element is damaged by the shock.

For this problem, it is considered that the lens is brought in pressure contact with the image pickup element while giving a prescribed pressure (see TOKKAIHEI No. 9-284617) by a lens holder and the lens and the image pickup element are fixed by cementing the lens holder to a base board. In this technology, there is a possibility that the lens is loosened when the pressure is reduced by a change with age in thickness of adhesive agents and in forms of parts, although play between the lens and the image pickup element is restrained. Further, there still is a fear the force of the shock makes the lens to damage the image pickup element.

SUMMARY OF THE INVENTION

The invention has been achieved in view of the problems stated above, and its object is to provide an image pickup device wherein manufacturing cost is low, the number of parts can be reduced, a size of the device can be made small, accurate assembling is possible under no adjustment, and structures for dustproof and moisture-proof are further provided.

The above objects can be achieved by the following structures:

An image pickup device provided on a base board, comprises:
   an image pickup element provided on the base board and including a photoelectrically converting section in which pixels are arranged, a peripheral surface formed around the photoelectrically converting section and a side surface crossing the peripheral surface;
   an optical member including a lens section to form an image of an object onto the photoelectrically converting section of the image pickup element, a leg section to support the lens section and a contact surface to be brought in contact with the image pickup element, wherein the lens section, the leg section and the contact surface are made in a single body; and
   wherein the optical member is mounted on the image pickup element such that the contact surface is brought in contact with the peripheral surface or with a surface member when the surface member is provided on the peripheral surface.

An image pickup device provided on a base board, comprises:
   an image pickup element provided on the base board and including a photoelectrically converting section in which pixels are arranged, a peripheral surface formed around the photoelectrically converting section and a side surface crossing the peripheral surface;
   an optical member including a lens section to form an image of an object on the photoelectrically converting section of the image pickup element, a leg section to support the lens section and a contact surface to be brought in contact with the image pickup element, wherein the lens section, the leg section and the contact surface are made in a single body; and
   a lens frame to retain the optical member;
   wherein the position between the lens section and the photoelectrically converting section of the image pickup element in the optical axis direction is determined by bringing the contact surface in contact with the peripheral surface or with a surface member when the surface member is provided on the peripheral surface, and
   wherein the position between the lens section and the photoelectrically converting section of the image pickup element in the direction perpendicular to the optical axis is determined by mounting the lens frame on the base board and by retaining the optical member with the lens frame.

Further, the above object may be achieved by the following structures:

An image pickup device of the first invention is represented by an image pickup device arranged on a base board having an image pickup unit placed on the base board which includes an image pickup element equipped with a photoelectrically-converting section on which pixels are arranged, a peripheral surface formed around the photoelectrically-converting section and a side surface that crosses the peripheral surface, and an optical member equipped with a lens section which forms subject images on the photoelectrically-converting section of the image pickup element and with a leg portion that supports the lens section, wherein the leg portion directly touches only the peripheral surface among the surfaces of the image pickup element, or touches the peripheral surface or a surface material only when the surface material is provided on the peripheral surface of the image pickup element.

An image pickup device of the second invention is represented by an image pickup device arranged on a base board having an image pickup unit placed on the base board which includes an image pickup element equipped with a photoelectrically-converting section on which pixels are arranged and a peripheral surface formed around the photoelectrically-converting section, an optical member equipped with a lens section which forms subject images on the photoelectrically-converting section of the image pickup element and with a leg portion that supports the lens section, and lens frame that holds the optical member, wherein the leg portion directly touches the peripheral surface of the image pickup element, or touches the peripheral surface or a surface material when the surface material is provided on the peripheral surface of the image pickup element, and thereby, the positioning in the direction of an optical axis for the lens section and the photoelectrically-converting section of the image pickup element is conducted, and the lens frame is provided on the base board, and thereby, the positioning in the direction perpendicular to an optical axis for the lens section and the photoelectrically-converting section of the image pickup element is conducted.

The image pickup device of the first invention is represented by an image pickup device arranged on a base board having an image pickup unit placed on the base board which includes an image pickup element equipped with a photoelectrically-converting section on which pixels are arranged, a peripheral surface formed around the photoelectrically-converting section and a side surface that crosses the peripheral surface, and an optical member equipped with a lens section which forms subject images on the photoelectrically-converting section of the image pickup element and with a leg portion that supports the lens section, wherein the leg portion directly touches only the peripheral surface among the surfaces of the image pickup element, or touches the peripheral surface or a surface material only when the surface material is provided on the peripheral surface of the image pickup element, and therefore, it is possible to position the lens section and the image pickup element in the direction of an optical axis without using the four corners and sides of the image pickup element which are relatively poor in surface accuracy. Incidentally, the surface material means a glass plate or the like that is stuck on the peripheral surface, to which, however, the invention is not limited. Incidentally, the peripheral surface of the present invention is a surface exiting on the substantially same flat surface with the surface of the photoelectrically converting section of the image pickup element and the side surface is excluded from the peripheral surface.

When a terminal for wiring for connecting the image pickup element to the base board is formed on the peripheral surface, in particular, if the touching point of the leg portion is structured to touch the peripheral surface at a point closer to the photoelectrically-converting section than the terminal for wiring, an interference with the terminal for wiring is controlled while the image pickup element is maintained to be in a compact construction, and highly accurate positioning can be attained.

Further, if the photoelectrically-converting section is arranged at the central portion of the image pickup element, it is possible to secure a broad area to be touched and to attain stable positioning, because an area that can be touched by the touching point of the leg portion on the peripheral surface can be arranged symmetrically about an optical axis of the lens portion.

Further, if an image processing circuit of the image pickup element is arranged inside the peripheral surface in the inner side of the image pickup element, it is not necessary to provide the image processing circuit on the base board on which an image pickup device is to be attached, and the base board can be made compact.

In addition, if there is provided an elastic member that presses the optical member in the direction of an optical axis, it is possible to press the lens section with appropriate force in the direction of an optical axis, by using elastic force of the elastic member, and no excessive stress is caused on a peripheral surface (active area) of the image pickup element in which a circuit and an element are arranged.

If there is provided a cover member capable of transmitting light at least partially which is arranged to be closer to a object than from the lens section and presses the lens section through the elastic member, the lens section is not exposed and is protected, which is preferable.

Further, if the portion of the cover member which can transmit light is formed by the material having infrared absorption characteristics, the number of parts can be reduced, which is preferable. However, it is also possible to coat a film having infrared reflection characteristics on the surface of the cover member, in place of, or in addition to forming the cover member with the material having infrared absorption characteristics.

In the image pickup device of the first invention, the leg portion of the optical member is sometimes arranged at the position in the vicinity of the photoelectrically-converting section of the image pickup element. However, by providing a first diaphragm that regulates the F number of the lens section and a second diaphragm provided at the object side positioned from the first diaphragm that regulates peripheral light flux, it is possible to reduce incidence of unwanted light and thereby to restrain that internal reflection from the leg portion arrives at the photoelectrically-converting section as a ghost. It is thereby possible to form images with high image quality.

Further, when the lens section is composed of a positive single lens which has, on the object side, a first diaphragm regulating the F number and has a surface that has a stronger curvature and faces the image side, it is possible to make a light flux entering a photoelectrically-converting section of the image pickup element to enter at an angle which is almost vertical, namely, to make it to be close to a telecentric system, and thereby to obtain images with high image quality. In addition, by making the lens section to be in a form of a positive lens whose surface having stronger curvature faces the image side, a distance between a first diaphragm and a principal point of the lens section can be made long, resulting in the preferable structure which is more close to the telecentric system.

When the lens section is composed of two or more lenses, the degree of freedom for correction of aberration is enhanced, and images with higher image quality can be obtained accordingly.

Further, when the lens section includes at least one positive lens and at least one negative lens, it is possible to correct excellently various aberrations such as spherical aberration and curvature of the field, by using these positive lens and negative lens. It is further possible to offset influences of changes in refractive index and changes in lens form both caused by temperature changes which tend to be a problem when the lens is made of a plastic material, and thereby to restrain the fluctuation of a position of the image point caused by temperature change to be small.

If the lens closest to the image side in the lens section is a positive lens, and a first diaphragm that regulates the F number is arranged to be closer to the object side than the lens closest to the image side, it is possible to improve telecentric characteristics of a light flux which enters a photoelectrically-converting section of the image pickup element.

In addition, if each lens is positioned in the direction perpendicular to an optical axis by engaging the surface provided on each lens of the lens section to be in parallel with its optical axis, optical axes of a plurality of lenses can easily be made to agree with each other.

The image pickup device of the second invention is represented by an image pickup device arranged on a base board having an image pickup unit placed on the base board which includes an image pickup element equipped with a photoelectrically-converting section on which pixels are arranged and a peripheral surface formed around the photoelectrically-converting section, an optical member equipped with a lens section which forms object images on the photoelectrically-converting section of the image pickup element and with a leg portion that supports the lens section and a lens frame that holds the optical member, wherein the leg portion directly touches the peripheral surface of the image pickup element, or touches the peripheral surface or a surface material when the surface material is provided on the peripheral surface of the image pickup element, and thereby the lens section and the photoelectrically-converting section of the image pickup element are positioned in the direction of an optical axis, and the lens section and the photoelectrically-converting section of the image pickup element are positioned in the direction perpendicular to the optical axis with installation of the lens frame on the base board, thus, it is possible to position the lens section and the photoelectrically-converting section in the direction of the optical axis without using the four corners and sides of the image pickup element which are relatively poor in surface accuracy, and it is possible to attain high accuracy for positioning at low cost without using the four corners and sides of the image pickup element which are relatively poor in surface accuracy, because positioning of the lens section and the photoelectrically-converting section in the direction perpendicular to the optical axis is attained by installation of the lens frame on the base board and by retaining the optical member with lens frame.

When a terminal for wiring for connecting the image pickup element to the base board is formed on the peripheral surface, in particular, if the touching point of the leg portion is structured to touch the peripheral surface at a point closer to the photoelectrically-converting section than the terminal for wiring, an interference with the terminal for wiring is controlled while the image pickup element is maintained to be in a compact construction, and highly accurate positioning can be attained.

Further, if the photoelectrically-converting section is arranged at the central portion of the image pickup element, it is possible to secure a broad area to be touched and to attain stable positioning, because an area that can be touched by the touching point of the leg portion on the peripheral surface can be arranged symmetrically about an optical axis of the lens portion.

Further, if an image processing circuit of the image pickup element is arranged inside the peripheral surface in the inner side of the image pickup element, it is not necessary to provide the image processing circuit on the base board on which an image pickup device is to be attached, and the base board can be made compact.

In addition, if there is provided an elastic member that presses the optical member in the direction of an optical axis for the lens frame, it is possible to press the optical member with appropriate force in the direction of an optical axis, by using elastic force of the elastic member, and no excessive stress is caused on a peripheral surface (active area) of the image pickup element in which a circuit and an element are arranged, which is preferable from the viewpoint of protection of the image pickup element. Further, even when great force is applied on the lens frame in the direction of an optical axis, the force is not transmitted directly to the image pickup element although it is transmitted to the base board, which is preferable from the viewpoint of protection of an image pickup element.

If there is provided a cover member capable of transmitting light at least partially which is arranged to be closer to a object than from the lens section and presses the lens section through the elastic member, the lens section is not exposed and is protected, which is preferable.

Further, if the portion of the cover member which can transmit light is formed by the material having infrared absorption characteristics, the number of parts can be reduced, which is preferable. However, it is also possible to coat a film having infrared reflection characteristics on the surface of the cover member, in place of, or in addition to forming the cover member with the material having infrared absorption characteristics.

If the optical member is arranged to be capable of being inserted in the lens frame from the object side, fabrication of the lens section is easy, and it is easy to introduce automatic incorporation.

In the image pickup device of the second invention, the leg portion of the optical member is sometimes arranged at the position in the vicinity of the photoelectrically-converting section of the image pickup element. However, by providing a first diaphragm that regulates the F number of the lens section and a second diaphragm provided at the object side positioned from the first diaphragm that regulates peripheral light flux, it is possible to reduce incidence of unwanted light and thereby to restrain that internal reflection from the leg portion arrives at the photoelectrically-converting section as a ghost. It is thereby possible to form images with high image quality.

Further, when the lens section is composed of a positive single lens which has, on the subject side, a first diaphragm regulating the F number and has a surface that has a stronger curvature and faces the image side, it is possible to make a light flux entering a photoelectrically-converting section of the image pickup element to enter at an angle which is almost vertical, namely, to make it to be close to a telecentric system, and thereby to obtain images with high image quality. In addition, by making the lens section to be in a form of a positive lens whose surface having stronger curvature faces the image side, a distance between a first diaphragm and a principal point of the lens section can be made long, resulting in the preferable structure which is more close to the telecentric system.

When the lens section is composed of two or more lenses, the degree of freedom for correction of aberration is enhanced, and images with higher image quality can be obtained accordingly.

Further, when the lens section includes at least one positive lens and at least one negative lens, it is possible to correct excellently various aberrations such as spherical aberration and curvature of the field, by using these positive lens and negative lens. It is further possible to offset influences of changes in refractive index and changes in lens form both caused by temperature changes which tend to be a problem when the lens is made of a plastic material, and thereby to restrain the fluctuation of a position of the image point caused by temperature change to be small.

If the lens closest to the image side in the lens section is a positive lens, and a first diaphragm that regulate the F number is arranged to be closer to the object side than the lens closest to the image side, it is possible to improve telecentric characteristics of a light flux which enters a photoelectrically-converting section of the image pickup element.

In addition, if each lens is positioned in the direction perpendicular to an optical axis by engaging the surface provided on each lens of the lens section to be in parallel with its optical axis, optical axes of a plurality of lenses can easily be made to agree with each other.

Further, to attain the object stated above, an image pickup device of the third invention has therein a base board, an image pickup element equipped with a photoelectrically-converting section having a photoelectrically-converting section, an optical member equipped with a lens section that forms a subject image on the photoelectrically-converting section of the image pickup element and with a leg portion that supports the lens section, and an elastic means, and is characterized in that the optical member is urged by the elastic force of the elastic means toward the image pickup element.

An image pickup device of the fourth invention has therein a base board, an image pickup element equipped with a photoelectrically-converting section having a photoelectrically-converting section, an optical member equipped with a lens section that forms a subject image on the photoelectrically-converting section of the image pickup element and with a leg portion that supports the lens section, and a lens frame that supports the optical member and is equipped with an elastic means, and is characterized in that the optical member is urged by the elastic force of the elastic means toward the image pickup element.

An image pickup device of the third invention has therein a base board, an image pickup element equipped with a photoelectrically-converting section having a photoelectrically-converting section, an optical member equipped with a lens section that forms a subject image on the photoelectrically-converting section of the image pickup element and with a leg portion that supports the lens section, and an elastic means, and is characterized in that the optical member is urged by the elastic force of the elastic means toward the image pickup element. Therefore, the optical member and the image pickup element can be positioned easily in the direction of an optical axis by urging the leg portion of the optical member by making it to touch the surface of the image pickup element, for example, and yet, it is possible to urge the optical member toward the image pickup element with a stable elastic force even when deformation such as a warp of parts is caused by a change with age, and thereby, it is possible to restrain play of the optical member in the case of occurrence of vibrations, and thus, damage of the image pickup element in the case of occurrence of shocks can be restrained. Incidentally, CMOS (Complementary Metal Oxide Semiconductor) is preferable as the image pickup element, but CCD (Charged Coupled Device) may also be used.

Further, when the elastic force of the elastic means makes the leg portion to be in contact with the surface of the image pickup element facing the lens section under the load ranging from 5 g to 500 g, damage of the image pickup element can be restrained by appropriate control of the elastic force.

If there is provided a cover member which is attached, to be closer to a object than the lens section, on a lens frame that is fixed on the base board, to press the elastic means, and if a part of that cover member is capable of transmitting light, the lens section can be protected. Namely, the cover member prevents the lens section from being exposed to the outside, which restrains that the lens section accidentally suffers force, resulting in damage of the image pickup element.

Further, if the elastic means is structured to be separate from the optical member and the cover member, what is required to be replaced for the appropriate control of the elastic force is only the elastic means, which results in cost reduction.

If the elastic means is represented by a coil spring, the elastic force can be displayed by the coil spring stably for a long time.

Further, if the elastic means is represented by a sheet-shaped member having an opening at its center, it makes it easy to incorporate, and it is preferable in terms of space saving.

If the sheet-shaped member is composed of a member having light-shielding characteristics and if the sheet-shaped member also has a function of a diaphragm regulating the F-number of the lens section, it is not necessary to provide a separate diaphragm, which is preferable in terms of reduction of the number of parts.

Further, if the elastic means is structured to be solid with the cover member, the number of parts is reduced, which is preferable.

Further, if the elastic means is structured to be solid with the optical member, the number of parts is reduced, which is preferable.

An image pickup device of the forth invention has therein a base board, an image pickup element equipped with a photoelectrically-converting section having a photoelectrically-converting section, an optical member equipped with a lens section that forms a subject image on the photoelectrically-converting section of the image pickup element and with a leg portion that supports the lens section, and a lens frame that supports the optical member and is equipped with an elastic means, and is characterized in that the optical member is urged by the elastic force of the elastic means toward the image pickup element. Therefore, the optical member and the image pickup element can be positioned easily in the direction of an optical axis by urging the leg portion of the optical member by making it to touch the surface of the image pickup element, for example, and yet, it is possible to urge the optical member toward the image pickup element with a stable elastic force even when deformation such as a warp of parts is caused by a change with age, and thereby, it is possible to restrain play of the optical member in the case of occurrence of vibrations, and thus, damage of the image pickup element in the case of occurrence of shocks can be restrained. Incidentally, CMOS is preferable as the image pickup element, but CCD may also be used.

Further, when the elastic force of the elastic means makes the leg portion to be in contact with the surface of the image pickup element facing the lens section under the load ranging from 5 g to 500 g, damage of the image pickup element can be restrained by appropriate control of the elastic force.

DETAILED DESCRIPTION OF THE PREFERRED EMBODIMENT

Figure 1:
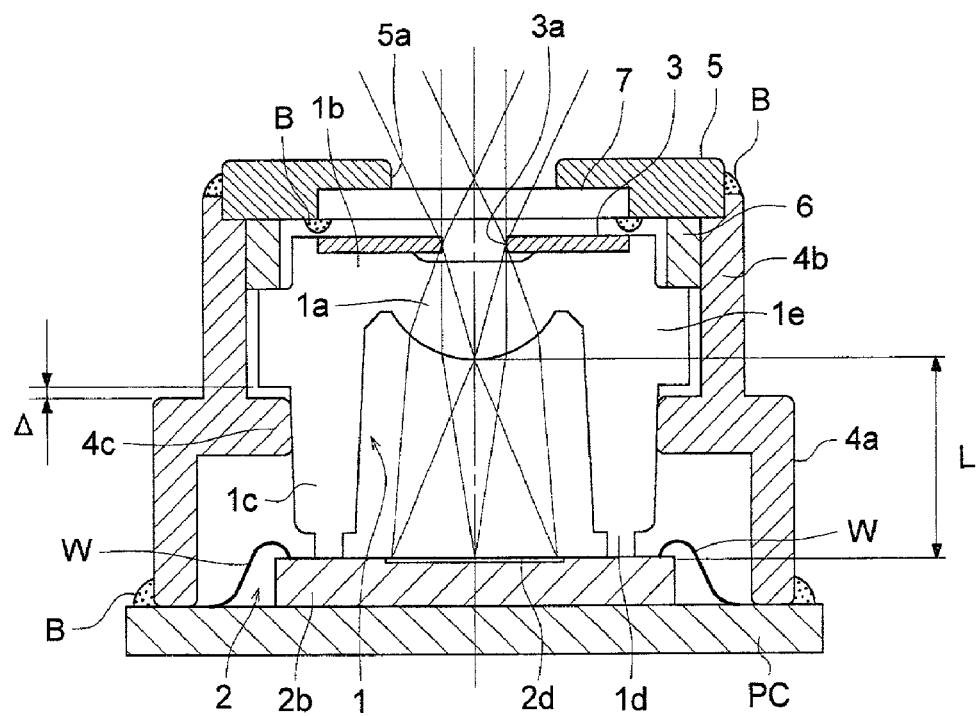
FIG. 1 is a sectional view of an image pickup device of the first embodiment.

A first embodiment of the invention will be explained as follows, referring to the drawings.

Figure 2:
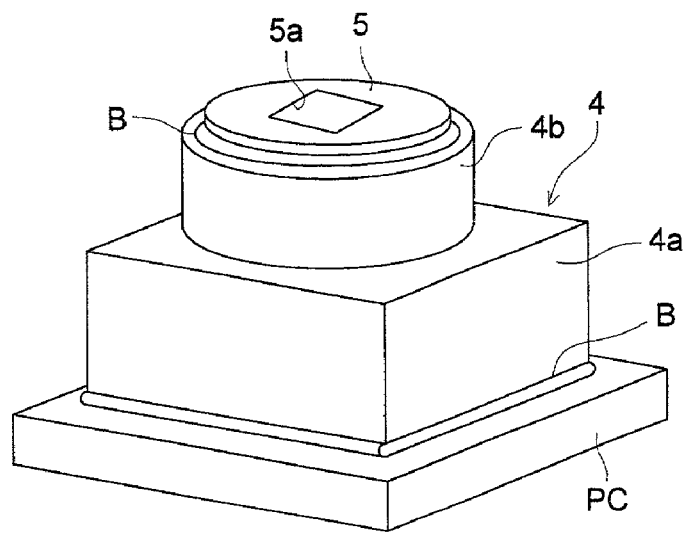
FIG. 2 is a perspective view of the image pickup device shown in FIG. 1.
Figure 3:
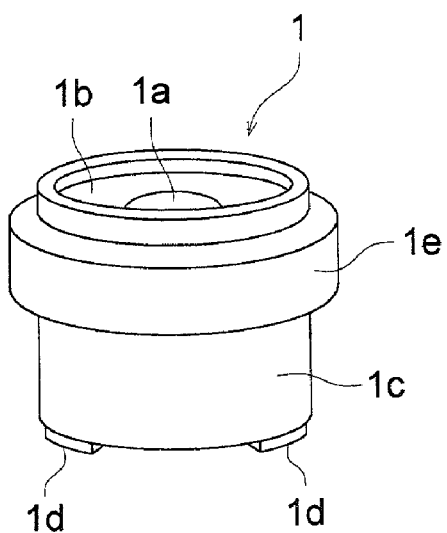
FIG. 3 is a perspective view of an optical member.
Figure 4:
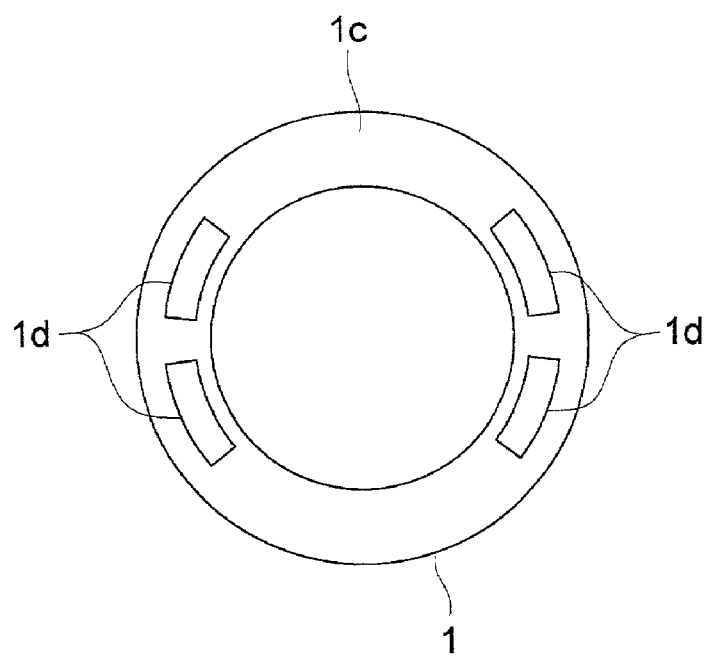
FIG. 4 is a diagram of a bottom surface of the optical member.
Figure 5:
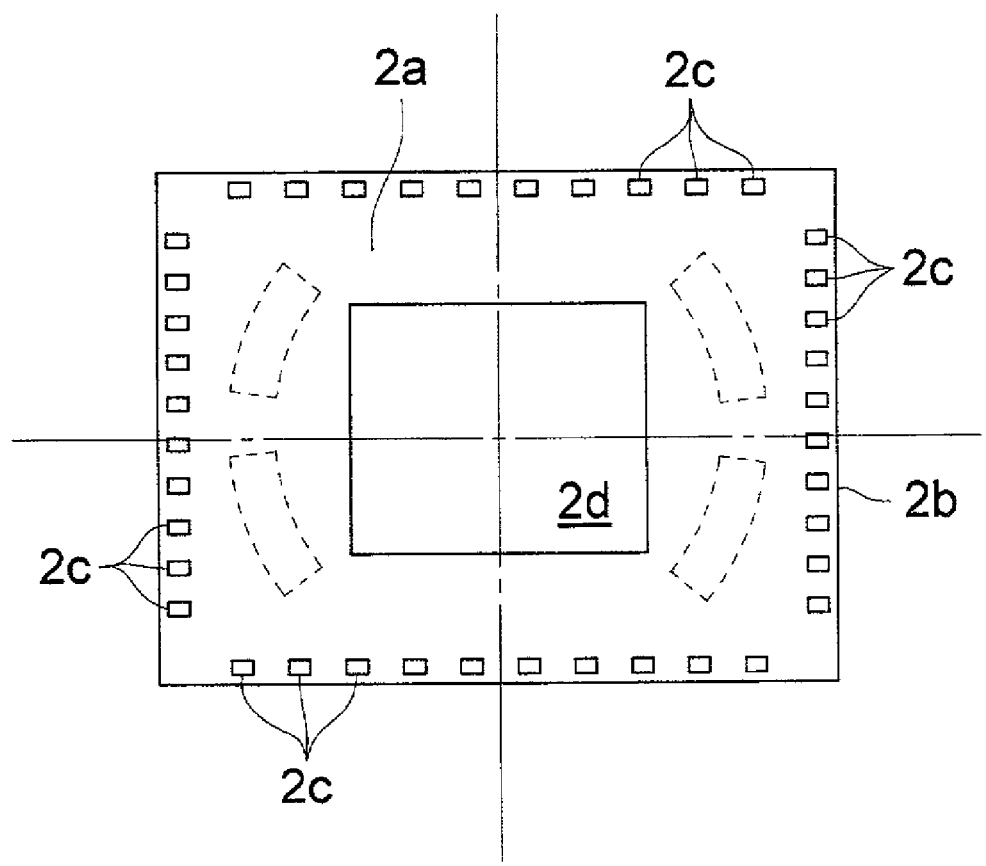
FIG. 5 is a diagram of a top surface of an image pickup element.
Figure 6:
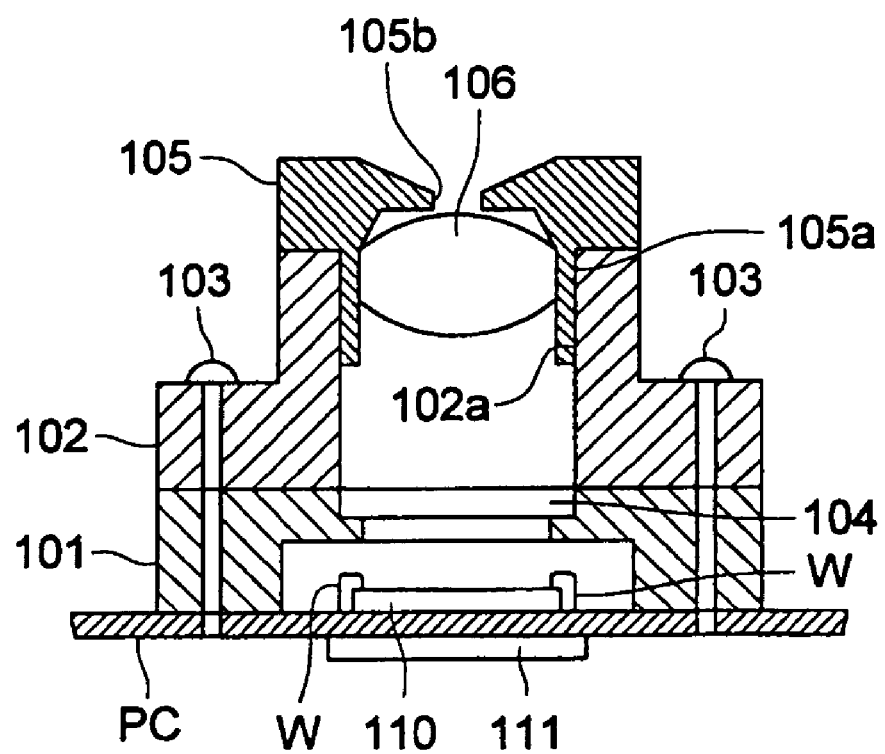
FIG. 6 is a sectional view showing an example of an image pickup device in the prior art.

FIG. 1 is a sectional view of an image pickup device of the embodiment of the invention. FIG. 2 is a perspective view of the image pickup device shown in FIG. 1. FIG. 3 is a perspective view of an optical member, and FIG. 4 is a bottom view of the optical member. FIG. 5 is a top view of an image pickup element.

With a transparent plastic material, optical member 1 is composed, in a single body, of tubular leg portion 1c, four contact sections 1d (a contacting surface of the bottom surface of each of the four contact sections 1d) formed at the lower end of the leg portion 1c as a part thereof, step portion 1e formed on a circumference at the upper end of the leg portion 1c, plate-shaped top face section 1b that covers the top end of the leg portion 1c and convex lens section 1a formed at the center of the top face section 1b as shown in FIGS. 1, 3 and 4. Incidentally, diaphragm plate 3 that is made of a light-shielding material and has aperture 3a as a first stop regulating the F number of convex lens section 1a is fixed through gluing on the top face of the face section 1b and around the convex lens 1a.

Outside the optical member 1, there is arranged lens frame 4 that is made of light-shielding material. As is apparent from FIG. 2, the lens frame 4 is provided with prismatic lower portion 4a and cylindrical upper portion 4b. The bottom end of the lower portion 4a is in contact with the upper side of base board PC and is fixed thereon with adhesive agent B. The top surface of the lower portion 4a is covered in terms of peripheral side by partition wall 4c, and on a circular inner surface of the partition wall 4c, there is engaged leg portion 1c of the optical member 1. Therefore, it is possible to position the lens section 1a accurately in the direction perpendicular to the optical axis for a photoelectrically-converting section 2d of image pickup element 2b which will be described later, simply by arranging and positioning the base board PC and lens frame 4 by using, for example, a photo-sensor (not shown) provided on an automatic assembling machine so as to coincident the center of a cylindrical inner surface of the partition wall 4c with the center of the photoelectrically-converting section.

On the other hand, light-shielding plate 5 is attached on the top of the upper portion 4b of the lens frame 4 with adhesives B. The light-shielding plate 5 has, on its center, aperture 5a representing the second diaphragm. Filter 7 made of a material having infrared absorption characteristics is attached under the aperture 5a of the light-shielding plate 5 with adhesives B. The light-shielding plate 5 and the filter 7 constitute a cover member.

In FIG. 1, elastic member 6 made of a rubber, a spring or the like is arranged between the light-shielding plate 5 and step portion 1e of the optical member 1, and the elastic member 6 is subjected to elastic deformation when the light-shielding plate 5 is attached on the lens frame 4, and the elastic force generated from the elastic deformation presses the optical member 1 downward in FIG. 1. Therefore, the force from the light-shielding plate 5 is not transmitted directly to image pickup element 2b although it is transmitted through the lens frame 4 to a base board PC. Incidentally, if the elastic member 6 is formed to be solid with diaphragm plate 3, the number of parts can be reduced.

In FIG. 5, image pickup unit 2 is composed of image pickup element 2b such as CMOS (Complementary Metal Oxide Semiconductor) type image sensor. A bottom surface of rectangular sheet-shaped image pickup element 2b is stuck on the upper surface of base board PC. At the center of the upper surface of the image pickup element 2b, there is formed a photoelectrically-converting section 2d on which pixels are arranged two-dimensionally, and peripheral surface 2a wherein an image processing circuit is structured in image pickup element 2b and inside thereof is formed around the photoelectrically-converting section. In the vicinity of an outer edge of the peripheral surface 2a that crosses a thin side surface right angles, there are arranged many pads 2c. The pad 2c representing a terminal for wiring is connected to base board PC through wire W as shown in FIG. 1. The wire W is connected to a prescribed circuit on the base board PC. Thus, image pickup element 2b includes a rlate (see, e.g., FIGS. 1 and 5) mounted on the base board PC, the photoeletrically converting section 2d provided on a top surface of the plate and having pickup elements (see, e.g., FIG. 5), a peripheral top surface 2a formed on the top surface of the plate around the photoelectrically converting section 2d (see, FIG. 5), and a side surface of the plate adjoining the peripheral top surface 2a (see, FIG. 1).

Further, as is clear from FIG. 4, contact section id of optical member 1 protrudes from a bottom end of leg portion 1c to be structured to constitute a part of the leg portion 1c, and it is arranged inside pad 2c on the peripheral surface (circumferential surface) 2a under the condition that the contact section id only is touching, as shown with dotted lines in FIG. 5. Therefore, with respect to the flatness of a surface, the bottom surface (contact surface) of the contact section id alone has only to be maintained within a prescribed range. Incidentally, the number of contact sections may be two or three although four contact sections are provided in the present embodiment. Since it is arranged so that clearance Δ is formed between the bottom surface of step portion 1e of optical member 1 and partition wall 4c of the lower portion 4a, under the condition that the contact section id is in contact with the peripheral surface 2a of image pickup element 2b, distance L between the lens section 1a and the photoelectrically-converting section 2d of the image pickup element 2b (namely, positioning in the direction of an optical axis) is established accurately by a length of leg portion 1c. Further, since the optical member 1 is made of a plastic material, it is also possible to reduce the deviation of focusing position caused by changes in refractive index of the lens section in temperature changes. Namely, in the case of a plastic lens, the refractive index of the lens is lowered as a temperature goes up, and an image forming position is changed to be farther from the lens section. On the other hand, since the leg portion 1c is extended by a rise in temperature, it has an effect to reduce the deviation of focusing position. Incidentally, since the optical member 1 in the present embodiment is made of a plastic material whose specific gravity is relatively small, it is lighter than glass that has the same volume, and is excellent in shock absorbing characteristics. Therefore, even when an image pickup device is dropped accidentally, damage of image pickup element 2b is restrained to the utmost, which is an advantage.

In the case of the structure wherein optical member 1 can rotate freely in lens frame 4 as shown in FIG. 5, it is impossible to avoid that contact section id interferes with pad 2c. Therefore, the structure wherein the rotation of the optical member 1 is regulated for assembling (for example, providing a rotation-stopper on lens frame 4) is preferable.

Operations of the present embodiment will now be explained. Lens section 1a of optical member 1 forms a subject image on the photoelectrically-converting section 2d of image pickup element 2b. The image pickup element 2b is arranged so that it can transform electric signals corresponding to an amount of the received light into image signals, and to output them through pad 2c and wire W.

Further, in the present embodiment, since the optical member 1 is attached to a peripheral section 2a of the image pickup element 2b without being attached to the base board PC, the adjustment for the lens section 1a in terms of a focusing position can be made unnecessary at the time of a set-up by controlling a dimensional accuracy of the leg portion 1c (including the contact section 1d) of an optical element 1 (or an accuracy of the distance L mentioned above).

Since the image pickup device of the present invention is not provided with an adjusting mechanism to conduct focusing in accordance with the object distance, as a lens, it is necessary to use a pan-focus lens capable of obtaining a proper focus point for any object positioned from a long distance to a short distance. Therefore, by coinciding an image forming point of the lens section 1a with the position of the photoelectrically-converting section 2d of the image pickup element 2b on the optical axis at the hyper-focal distance $U \approx f^2/(F \times 2P)$ (where f is the focal length of the lens, F is the F-number of the lens and P is the pitch of pixels of the image pickup elements), the focusing can be deemed from a view point of geometrical optics as the condition that a focus point is obtained for an object at a distance of U/2 from an infinite point.

For example, in the case that f=3.2 m, F=2.8 and P=0.0056 mm, if the abovementioned distance L is set so as to coincident the image forming point of the lens section 1a at the hyper-focal distance $U \approx f^2/(F \times 2P)=0.33$ m as a reference object distance with the position of the photoelectrically-converting section 2d of the image pickup element 2b on the optical axis, a focus point can be obtained for any object positioned from a infinite point to a distance of 0.17 m. Further, if it is not necessary to deem the hyper-focal distance as the reference object distance and a weight point, for example, is placed an image quality of an image at a long distance, the reference object distance may be set at a longer distance than the hyper-focal distance. (More concretely, the above distance L may be set to be a slightly shorter one.).

Here, with regard to an accuracy of the distance L, in order to make it unnecessary to adjust a focal point as the pan-focus lens, it is necessary to suppress the deviation along the optical axis between the position of the photoelectrically-converting section 2d of the image pickup element 2b and the image forming point of the lens section 1a at the reference object distance to an extent of $\pm 0.5 \times (F \times 2P)$ in terms of an air-conversion length (F is the F-number of the image pickup lens and P is the pitch of pixels of the image pickup elements). More preferably, it may suppressed to an extent of $\pm 0.25 \times (F \times 2P)$. If the deviation can be suppressed to the above extent, the image quality of an object at an infinite point or at a closer point can be maintained properly.

As stated above, in the present embodiment, contact section id on leg portion 1c of the optical member 1 touches peripheral surface 2a of image pickup element 2b and thereby lens section 1a and the photoelectrically-converting section 2d of the image pickup element 2b are positioned in the direction of an optical axis, and therefore, it is possible to position the lens section 1a and the photoelectrically-converting section 2d of the image pickup element 2b in the direction of an optical axis without using the four corners of the image pickup element 2b which are relatively poor in surface accuracy. Further, with installation of the lens frame 4 on the base board PC based on the position of the photoelectrically-converting section 2d of the image takeup element as a reference point of positioning, the lens section 1a and the photoelectrically-converting section 2d of the image pickup element 2b are positioned in the direction perpendicular to the optical axis, thus it is possible to attain high positioning accuracy at low cost without using, in the same way, the four corners of the image pickup element 2b which are relatively poor in surface accuracy.

When pad 2c and wire W for connecting image pickup element 2b with base board PC are formed on peripheral surface 2a of the image pickup element 2b, in particular, if contact section 1d on leg portion 1c is arranged to touch peripheral surface 2a at a position closer to the photoelectrically-converting section 2d than pad 2c, it is possible to secure a large area for touching for the contact section 1d while keeping the image pickup element 2b in a compact structure, and thereby to stabilize the optical member 1 and to restrain surface pressure on the touching surface to be low, thus, interference with pad 2c and wire W can be controlled while the image pickup element 2b is protected, and highly accurate positioning can be attained. When the photoelectrically-converting section 2d is arranged at the central section of the image pickup element 2b, an area which can be touched by contact section id of leg portion 1c in peripheral surface 2a can be arranged to be symmetrical about an optical axis of the lens section 1a, and thereby it is possible to secure the bottom area of the contact section id to be broad, and to attain stable positioning, while keeping the image pickup element 2b in a compact structure. It is preferable to make the center of the photoelectrically-converting section 2d to agree with the center of the image pickup element 2b as shown in FIG. 5. Due to this, a structure of the whole of the image pickup element 2b turns out to be almost symmetrical about an optical axis of lens section 1a of optical member 1, which can simplify parts shapes. Incidentally, lens frame 4 is glued on base board PC to be sealed hermetically by that gluing and other two gluing points so that foreign substances may not enter any portions of the image pickup device, thus, it is possible to eliminate an adverse effect of foreign substances on the photoelectrically-converting section 2d of the image pickup element 2b. It is preferable that adhesives used for these items have moisture-proofing characteristics. Due to this, it is possible to avoid surface deterioration of an image pickup element and of a pad caused by an entry of moisture.

Further, since there is provided elastic member 6 that presses lens section 1a in the direction of an optical axis for lens frame 4, it is possible to press the lens section 1a with appropriate force in the direction of an optical axis, by using elastic force of the elastic member 6, and no excessive stress is caused on peripheral surface 2a of image pickup element 2b in which a circuit is arranged. Further, even when great force is applied on lens frame 4 in the direction of an optical axis, the force is not transmitted directly to the image pickup element 2b although it is transmitted through the lens frame 4 to the base board PC. It may be preferable from the viewpoint of protection of image pickup element 2b.

Since a cover member composed of light-shielding plate 5 and filter 7 is arranged to be closer to the object side than lens section 1a, the lens section is not exposed and is protected, and sticking of foreign materials on the lens surface can also be avoided. Further, since filter 7 is made of a material having infrared absorbing characteristics, it is not necessary to provide an infrared absorption filter separately, and the number of parts can be reduced, which is preferable. It is also considered to use a material having infrared absorption characteristics for making optical member 1 itself or to coat a film having infrared reflection characteristics on the surface of lens 1a, in place of giving infrared absorption characteristics to the filter 7.

Further, in the course of assembling, the optical member 1 can be inserted in lens frame 4 from the subject side under the condition that light-shielding plate 5 is removed from the lens frame 4, and after that, the light-shielding plate 5 can be attached on the lens frame 4. This construction makes fabrication of the optical member 1 to be easy, and makes it easy to introduce automatic assembly. In this case, if an air vent hole is formed on lower portion 4a of the lens frame 4, the optical member 1 can be inserted in the lens frame 4 easily even when a clearance between the lens frame 4 and the optical member 1 is small. With regard to the air vent hole, however, it is preferable to fill up the air vent hole with fillers after the insertion and to restrain surface deterioration for the image pickup element and the pad caused by entrance of foreign materials from the outside or by moisture. With regard to the fillers in this case, those having light-shielding characteristics to restrain light leakage are preferable. Incidentally, it is possible either to insert optical member 1 after gluing optical member 1 on the lens frame 4, or to insert the optical member 1 in the lens frame 4 and then to glue that unit including the optical member 1 and the lens frame 4 on the base board PC, which secures the degree of freedom for a process of fabrication. In the case of latter fabrication procedures, partition wall 4c of the lens frame 4 can also have a function to prevent the optical member 1 from coming off.

Since leg portion 1c of the optical member 1 is arranged in the vicinity of photoelectrically-converting section 2d of image pickup element 2b, there are fears that a light flux that does not contribute to image forming is reflected on the leg portion 1c and enters photoelectrically-converting section 2d, causing a ghost image or flare. To prevent this, it is effective to arrange a second diaphragm (aperture 5a) that regulates a peripheral light flux to be closer to the object side than a first diaphragm (aperture 3a) that regulates F number of lens section 1a, and thereby to reduce entrance of unwanted light. Incidentally, further effect can be obtained by making aperture 5a of the second diaphragm to be a rectangle, because a field angle is different in each of the shorter side direction, the longer side direction and the diagonal direction of the rectangle. Though this function is owned by aperture 5a of light-shielding plate 5 in the present embodiment, it is also possible to form a diaphragm through coating or application of a film having light-shielding characteristics at a location closer to the subject side than filter 7 in addition to necessary apertures. For the same reason, it is preferable to conduct anti-internal-reflection processing on at least a part of the leg portion 1c. The anti-internal-reflection processing includes, for example, forming a surface whose surface is rough in terms of surface roughness and thereby making a light flux contributing to no image forming to be scattered, anti-reflection coating, or coating of paints having low reflection characteristics.

Since diaphragm plate 3 equipped with aperture 3a is provided on the plane of incidence side of lens section 1a, it is possible to make a light flux entering photoelectrically-converting section 2d of image pickup element 2b to enter at an angle which is almost vertical, namely, to make it to be close to a telecentric system, and thereby to obtain images with high image quality. In addition, by making a form of lens section 1a to be in a form of a positive lens whose surface having stronger curvature faces the image side, a distance between a first diaphragm (aperture 3a) and a principal point of the lens section 1a can be made long, resulting in the preferable structure which is more close to the telecentric system. In the present embodiment, the lens section 1a is made to be in a form of a positive meniscus lens. For obtaining images with higher image quality, it is preferable to structure a lens portion with plural lenses, as in the third embodiment described later.

Figure 7:
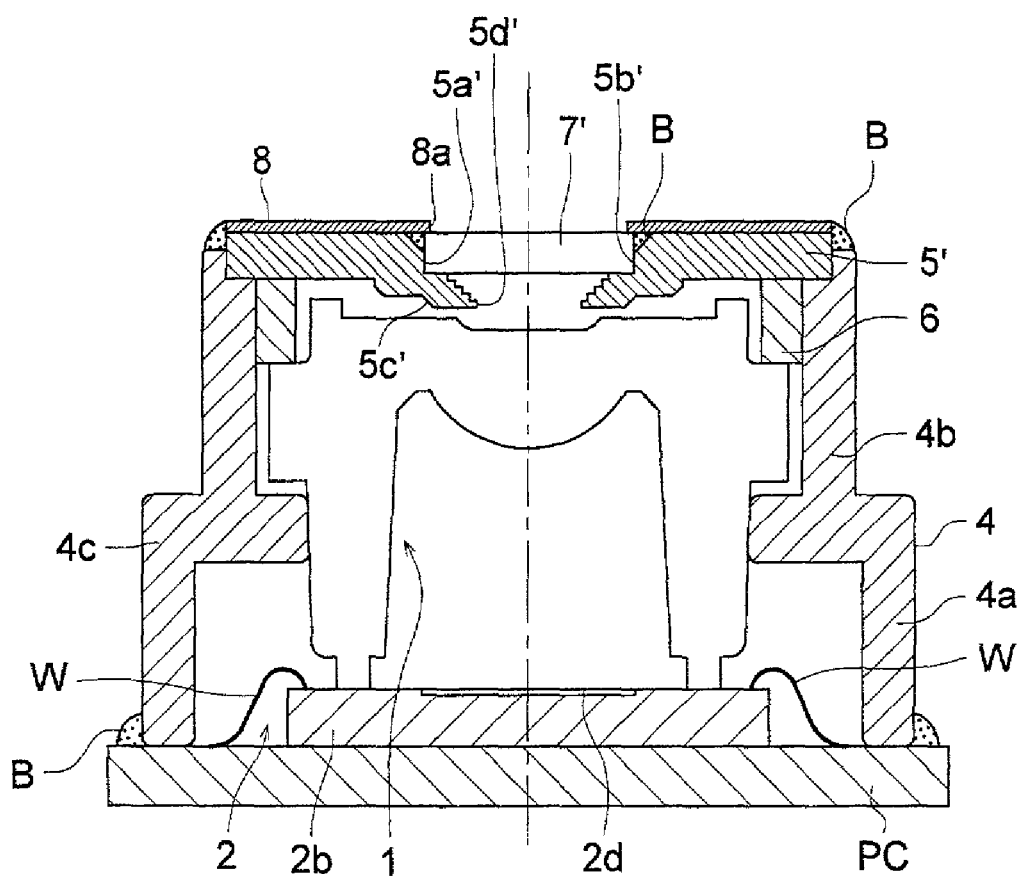
FIG. 7 is a sectional view of an image pickup device of the second embodiment.

FIG. 7 is a diagram showing an image pickup device in the second embodiment. In the second embodiment, all structures are the same as those in the embodiment which has been explained above, except that structures of a diaphragm plate and of a light-shielding plate are changed, therefore, other same structures are given the same symbols and explanation for them will be omitted.

On top of upper portion 4b of lens frame 4, holding member 5', having on its upper surface, thin light-shielding sheet 8 is fixed with adhesives B, in FIG. 7. In aperture 5a' located at the center of the holding member 5' which is made of a material having light-shielding characteristics, there is fit filter 7' made of a material having infrared absorption characteristics. On an upper edge of the aperture 5a' of the holding member 5', there is formed tapered surface 5b', and the holding member 5' and the filter 7' are cemented each other by applying adhesive B on the tapered surface S b'. Further, the holding member 5' is provided with tapered section 5c' which is protruded downward toward the lower portion of the aperture 5a' while its inside diameter is reduced stepwise, and its lowermost portion having the smallest inside diameter constitutes first diaphragm 5d'. Further, central aperture 8a of the light-shielding sheet 8 constitutes a second diaphragm. The holding member 5', filter 7' and light-shielding sheet 8 constitute a cover member.

Since a cover member composed of holding member 5', filter 7' and light-shielding sheet 8 is arranged to be closer to the subject side than lens section 1a of optical member 1, the lens section is not exposed and is protected, and sticking of foreign materials on the lens surface can also be avoided in the present embodiment. Further, since the cover member can be formed integrally, it contributes to reduction of the number of parts for the total image pickup device.

Since leg portion 1c of optical member 1 is arranged in the vicinity of photoelectrically-converting section 2d of image pickup element 2b in the same way as in the aforesaid embodiment, there are fears that a light flux that does not contribute to image forming is reflected on the leg portion 1c and enters photoelectrically-converting section 2d, causing a ghost image or flare. In the present embodiment, a second diaphragm (aperture 8a) that regulates a peripheral light flux is arranged to be closer to the object side than a first diaphragm 5a' that regulates F number of lens section 1a, and thereby entrance of unwanted light is reduced. Incidentally, further effect can be obtained by making aperture 8a of the second diaphragm to be a rectangle, because a field angle is different in each of the shorter side direction, the longer side direction and the diagonal direction of the photoelectrically-converting section 2d of image pickup element 2b.

Figure 8:
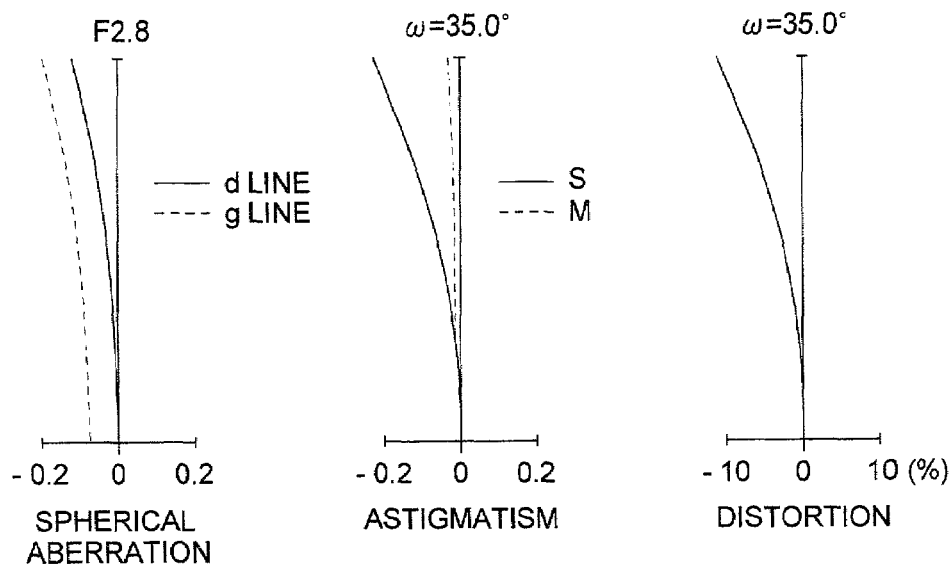
FIG. 8 is an aberration diagram relating to the first example (Example 1) of lens section 1a of optical member 1 which can be applied to the embodiments in FIG. 1 and FIG. 7.

FIG. 8 is an aberration diagram relating to the first example (Example 1) of lens section 1a of optical member 1 which can be applied to the embodiment shown in FIGS. 1 and 7. "Table 1" shows lens data of a lens section of the present example.

TABLE 1

Example 1
f = 3.21
F = 2.8
2ω = 70.0°

| Surface No. | r | d | nd | vd |
|---|---|---|---|---|
| 1 (Diaphragm) | ∞ | 0.20 | | |
| *2 | −10.428 | 1.60 | 1.53000 | 55.5 |
| *3 | −1.539 | | | |

Aspheric surface coefficient

Second surface

K = 0.0
A4 = −5.59450 × 10$^{-2}$

TABLE 1-continued

A6 = −2.90680 × 10$^{-2}$
A8 = −4.98890 × 10$^{-3}$
A10 = −1.38940 × 10$^{-3}$
A12 = −1.53220 × 10$^{-3}$

Third surface

K = 0.0
A4 = 7.96360 × 10$^{-3}$
A6 = 2.83640 × 10$^{-4}$
A8 = 3.51190 × 10$^{-5}$
A10 = 1.61030 × 10$^{-5}$
A12 = 9.74630 × 10$^{-6}$

With regard to symbols in the table used in the specification, f represents a focal length (mm) of the total system, F represents F number, ω represents a half angle of view (°), r represents a radius of curvature (mm), d represents a distance between surfaces on an axis (mm), nd represents a refractive index for d line and vd represents Abbe number.

The symbol "*" in the Surface No. shows an aspheric surface, and this aspheric surface is expressed by the following expressions under the condition that the vertex curvature is represented by C, the constant of the cone is represented by K and aspheric surface coefficient is represented by $A_4$, $A_6$, $A_8$, $A_{10}$ and $A_{12}$ in the rectangular coordinates wherein the origin is represented by the vertex of the surface and an X axis is represented by the direction of an optical axis.

Numeral 1

$$X = \frac{Ch^2}{1 + \sqrt{1 - (1+K)C^2h^2}} + A_4h^4 A_6h^6 A_8h^8 A_{10}h^{10} A_{12}h^{12}$$ Numeral 1

Numeral 2

$$h = \sqrt{Y^2 + Z^2}$$ Numeral 2

Figure 9:
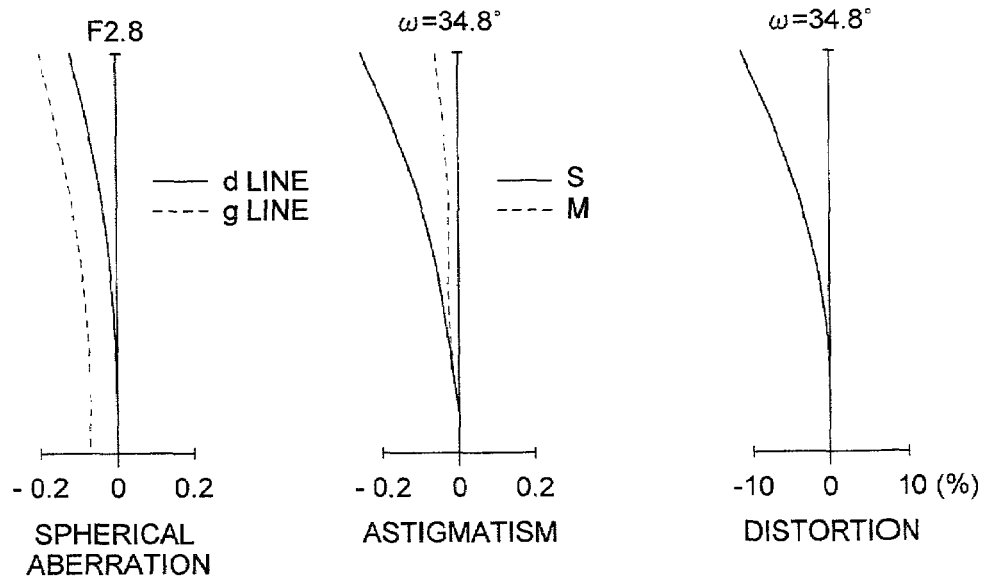
FIG. 9 is an aberration diagram relating to the second example (Example 3) of lens section 1a of optical member 1 which can be applied to the embodiments in FIG. 1 and FIG. 7.

FIG. 9 is an aberration diagram relating to the second example (Example 2) of lens section 1a of optical member 1 which can be applied to the embodiment shown in FIGS. 1 and 7. "Table 2" shows lens data of a lens section of the present example.

TABLE 2

Example 2
f = 3.23
F = 2.8
2ω = 69.6°

| Surface No. | r | d | nd | vd |
|---|---|---|---|---|
| 1 (Diaphragm) | ∞ | 0.20 | | |
| *2 | −11.087 | 1.60 | 1.50920 | 56.5 |
| *3 | −1.500 | | | |

Aspheric surface coefficient

Second surface

K = 0.0
A4 = −5.80000 × 10$^{-2}$
A6 = −2.80000 × 10$^{-2}$
A8 = −9.00000 × 10$^{-3}$

TABLE 2-continued

A10 = −7.50000 × 10$^{-3}$
A12 = −1.70000 × 10$^{-2}$

Third surface

K = 0.0
A4 = 9.20000 × 10$^{-3}$
A6 = 7.00000 × 10$^{-4}$
A8 = 1.00000 × 10$^{-4}$
A10 = 7.00000 × 10$^{-5}$
A12 = 5.00000 × 10$^{-5}$

Figure 10:
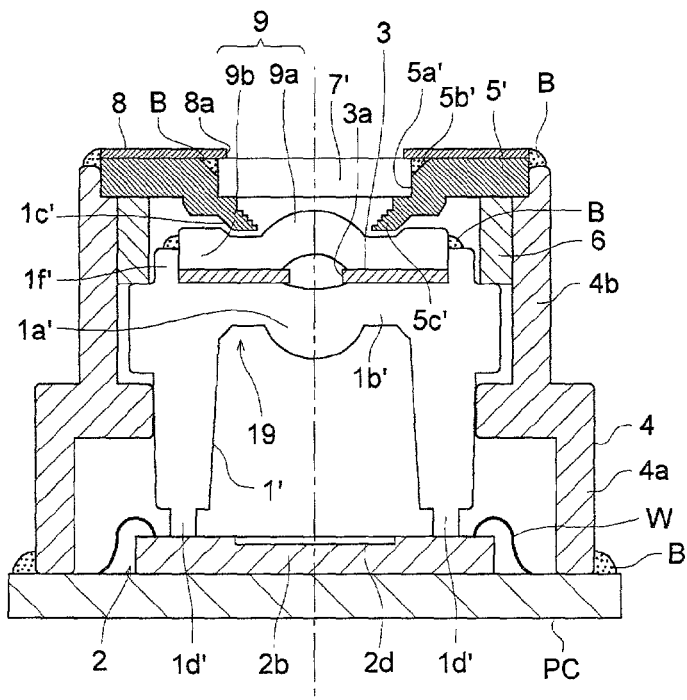
FIG. 10 is a sectional view of an image pickup device of the third embodiment.

FIG. 10 is a diagram showing an image pickup device of the third embodiment. In the third embodiment, main points different from those in the second embodiment are that the structure of the optical member has been changed so that a plurality of lens sections may be provided. With regard to other similar structures including the contact position between the leg portion and the image pickup element, therefore, same symbols are given to them and explanation therefore will be omitted.

In FIG. 10, optical member 19 is composed of lens 1' closer to an image and lens 9 closer to a object. Though the lens 1' closer to an image is in a form which is similar to that of the optical member shown in FIG. 1, a height in the optical axis direction of ring section 1f formed on the upper portion of the lens 1' is greater than that in the optical member shown in FIG. 1. On upper surface 1b' that is inside the ring section 1f in its radial direction, there is arranged the lens 9 closer to a subject through diaphragm plate 3 that regulates the F number. The lens 9 closer to a object is composed of flange section 9b that is fitted in an internal circumference of the ring section 1f and of lens section 9a that is formed at the center. The lens section 9a of the lens 9 closer to a object is a negative lens, while lens section 1a' of the lens 1' closer to an image is a positive lens. Incidentally, the diaphragm plate 3 in the present embodiment functions as a spacer that regulates a distance between lens sections 1a' and 9a, and aperture 3a of the diaphragm plate 3 functions as a first diaphragm that regulate the F number.

since an internal peripheral surface of the ring section 1f of the lens 1' closer to an image and an outer peripheral surface of the flange section 9b of the lens 9 closer to a object are of the same diameter and are in parallel with an optical axis, it is possible to position the lens sections 1a' and 9a in the direction perpendicular to an optical axis when these internal peripheral surface and outer peripheral surface are engaged, and thereby to make their optical axes to be agreed easily. Incidentally, the lens 9 closer to a object is cemented with the lens 1' closer to an image by adhesives B applied on the circumference of the lens 9.

Holding member 5' on top of which thin light-shielding sheet 8 is stuck is attached on the upper end of upper portion 4b of lens frame 4 by adhesives B. Filter 7' made of a material having light-shielding characteristics is arranged to be fitted in aperture 5a' located at the center of the holding member 5' that is made of a material having light-shielding characteristics. On an upper edge of the aperture 5a' of the holding member 5', there is formed tapered surface 5b', and it is possible to cement the filter 7' with the holding member 5' by applying adhesives B on the tapered surface. Further, the holding member 5' is provided with tapered section 5c' which is protruded downward toward the lower portion of the aperture 5a' while its inside diameter is reduced stepwise, and the portion functions as a light-shielding section that restrains entrance of unwanted light. Incidentally, the central aperture 8a on the light-shielding sheet 8 constitutes a second diaphragm.

Figure 11:
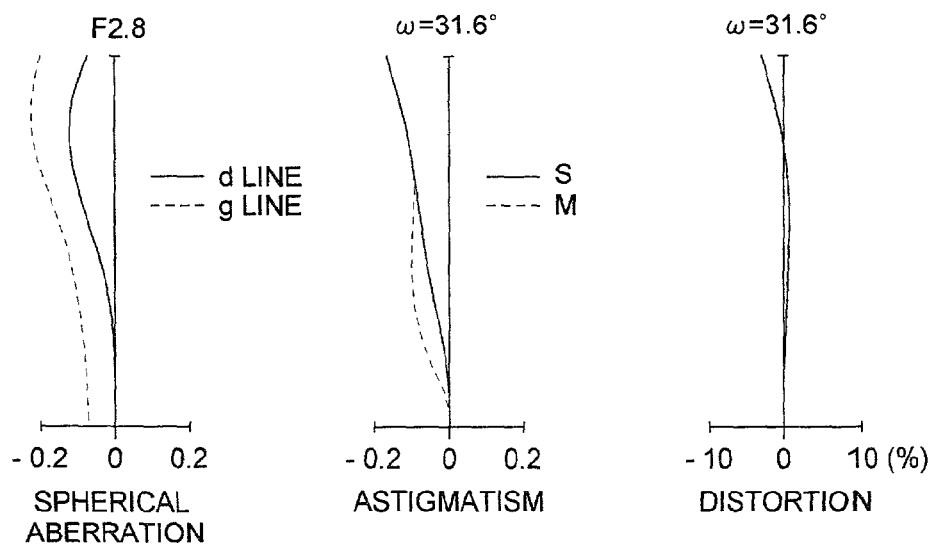
FIG. 11 is an aberration diagram relating to the third example (Example 3) of lens sections 1a' and 9a of optical member 19 which can be applied to the embodiment in FIG. 10.

FIG. 11 is an aberration diagram relating to the third example (Example 3) of lens section (1a' and 9a) of optical member 19 which can be applied to the embodiment shown in FIG. 10. "Table 3" shows lens data of the lens section of the present example.

TABLE 3

Example 3
f = 3.22
F = 2.8
2ω = 63.2°

| Surface No. | r | d | nd | vd |
|---|---|---|---|---|
| *1 | 1.332 | 0.80 | 1.49200 | 57.0 |
| 2 (Diaphragm) | 0.893 | 0.30 | | |
| *3 | ∞ | 0.30 | | |
| *4 | −3.983 | 1.30 | 1.49200 | 57.0 |
| *5 | −1.009 | | | |

Aspheric surface coefficient

Figure 12:
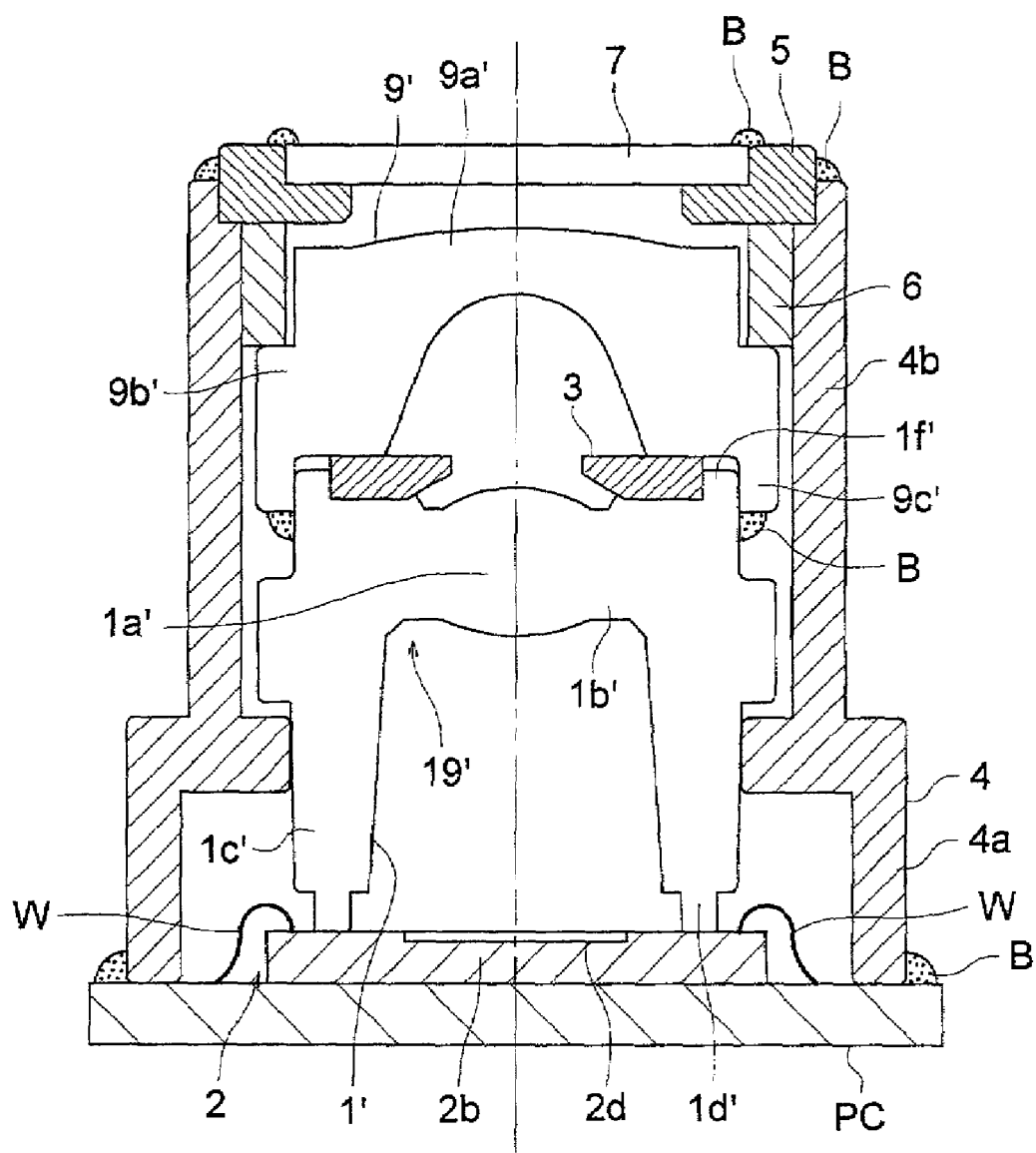
FIG. 12 is a sectional view of an image pickup device of the third embodiment.

First surface $K = -1.00900 \times 10^{-2}$
$A4 = 6.72900 \times 10^{-2}$
$A6 = -7.67070 \times 10^{-2}$
$A8 = 1.34680 \times 10^{-1}$
$A10 = -9.41020 \times 10^{-2}$
$A12 = 6.56810 \times 10^{-2}$ Second surface $K = 9.62490 \times 10^{-3}$
$A4 = 1.38900 \times 10^{-1}$
$A6 = -2.64240 \times 10^{-1}$
$A8 = 2.65220 \times 10^{+0}$
$A10 = -3.53590 \times 10^{-1}$
$A12 = -8.27250 \times 10^{-2}$ Fourth surface $K = -1.00000 \times 10^{-2}$
$A4 = -6.43510 \times 10^{-2}$
$A6 = -3.56320 \times 10^{-1}$
$A8 = 2.02750 \times 10^{-1}$
$A10 = -6.60380 \times 10^{-1}$
$A12 = -3.70030 \times 10^{-1}$ Fifth surface $K = -1.44350 \times 10^{-1}$
$A4 = 7.14590 \times 10^{-2}$
$A6 = -2.15930 \times 10^{-1}$
$A8 = 4.23870 \times 10^{-1}$
$A10 = -3.76120 \times 10^{-1}$
$A12 = 1.30790 \times 10^{-1}$ FIG. 12 is a diagram showing an image pickup device of the fourth embodiment. Even in the fourth embodiment, main points different from those in the first embodiment and the second embodiment are that the structure of the optical member has been changed so that a plurality of lens sections may be provided. With regard to other similar structures, therefore, same symbols are given to them and explanation therefore will be omitted.

In FIG. 12, optical member 19' is composed of lens 1' closer to an image and lens 9' closer to a subject both being made of a plastic material. Though the lens 1' closer to an image is in a form which is similar to that of the optical member 1 shown in FIG. 1, a height in the optical axis direction of ring section 1f' formed on the upper portion of the lens 1' is greater than that in the optical member 1. On upper portion of upper surface section 1b', there is arranged the lens 9' closer to a object through diaphragm plate 3 that regulates the F number. The lens 9' closer to a subject is composed of cylinder section 9c' that is fitted with an outer peripheral surface of ring section 1f', lens section 9a' that is formed at the center and step portion 9b' that is provided on an outer peripheral surface of lens portion 9a'. The lens section 9a' of the lens 9' closer to a object is a negative lens, while lens section 1a' of the lens 1' closer to an image is a positive lens. Incidentally, the diaphragm plate 3 functions as a spacer that regulates a distance between lens sections 1a' and 9a'.

In the present embodiment, elastic member 6 is in contact with lens 9' closer to a subject and with step portion 9b', and therefore, its elastic force is transmitted from the lens 9' closer to a subject to lens 1' closer to an image through diaphragm plate 3. since an outer peripheral surface of the ring section 1f' of the lens 1' closer to an image and an internal peripheral surface of the cylinder section 9c' of the lens 9' closer to a subject are of the same diameter and are in parallel with an optical axis, it is possible to position the lens sections 1a' and 9a' in the direction perpendicular to an optical axis when these outer peripheral surfaces are engaged, and thereby to make their optical axes to be agreed easily. Incidentally, the lens 9' closer to a subject is cemented with the lens 1' closer to an image by adhesives B applied on the lower end of cylinder section 9c'.

Figure 13:
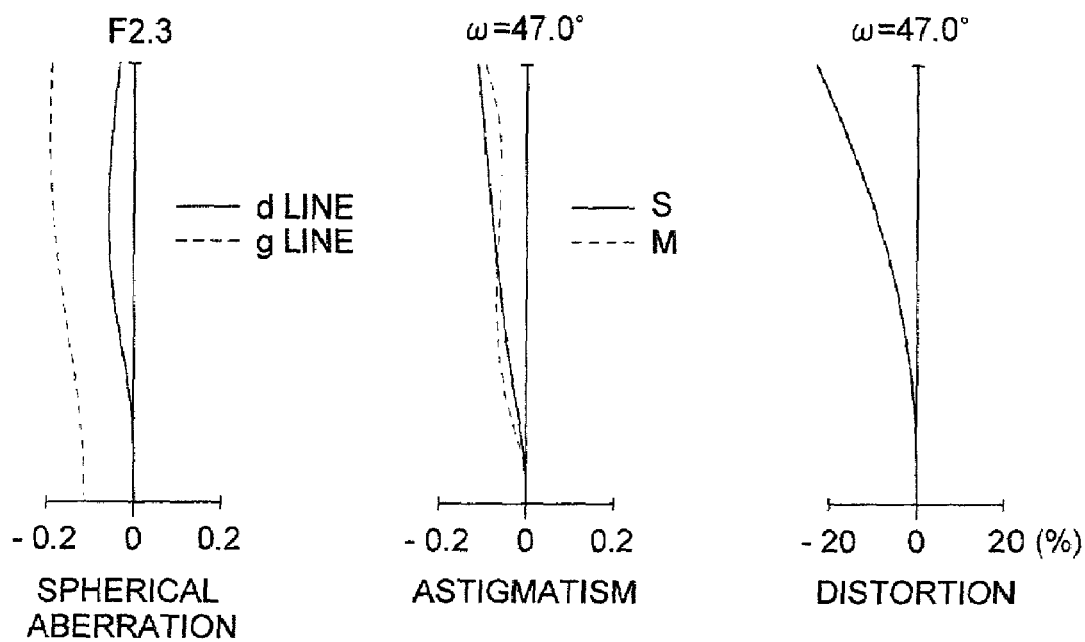
FIG. 13 is an aberration diagram relating to the fourth example (Example 4) of lens sections 1a' and 9a' of optical member 19' which can be applied to the embodiment in FIG. 12.

FIG. 13 is an aberration diagram relating to the fourth example (Example 4) of lens section (1a' and 9a') of optical member 19' which can be applied to the embodiment shown in FIG. 12. "Table 4" shows lens data of the lens section of the present example.

TABLE 4

Example 4
f = 2.30
F = 2.4
2ω = 94.0°

| Surface No. | r | d | nd | vd |
|---|---|---|---|---|
| *1 | 9.231 | 1.00 | 1.49700 | 56.0 |
| 2 (Diaphragm) | 1.230 | 2.20 | | |
| *3 | ∞ | 0.20 | | |
| *4 | 2.243 | 1.70 | 1.49700 | 56.0 |
| *5 | −2.240 | | | |

Aspheric surface coefficient

First surface $K = 3.72320 \times 10^{-2}$
$A4 = -2.20320 \times 10^{-3}$
$A6 = 1.10670 \times 10^{-4}$ Second surface $K = -1.57520 \times 10^{-1}$
$A4 = -9.78620 \times 10^{-3}$
$A6 = 8.00560 \times 10^{-3}$ Fourth surface $K = 8.65710 \times 10^{-1}$
$A4 = -1.36460 \times 10^{-2}$
$A6 = 5.99080 \times 10^{-3}$ Fifth surface $K = -6.40440 \times 10^{-1}$
$A4 = 1.83630 \times 10^{-2}$
$A6 = 2.45110 \times 10^{-2}$ In the present example, at least one positive lens 1a' and at least one negative lens 9a' are provided, and thereby, correction of spherical aberration and of curvature of field can be conducted satisfactorily. Further, correction of chromatic aberration is also easy. By combining positive lens 1a' and negative lens 9a', it is also possible to cancel adverse effects of changes in refractive index and in lens form both caused by temperature changes which tend to be a problem when a lens is made of a resin material, and thereby to restrain fluctuations in positions of an image point caused by temperature changes to be small.

When an optical system for photographing is composed of two or more lenses as in lens sections 1a' and 9a', the degree of freedom for correction of aberration is increased, which makes it possible to obtain images with high image quality.

Further, if lens section 1a' closest to an image is a positive lens, and a diaphragm (aperture 3a) that regulates the F number is arranged to be closer to a object than lens section 1a' closest to an image, it is possible to improve telecentric characteristics of a light flux that enters photoelectrically-converting section 2d of image pickup element 2b. When two lenses are used as in the third embodiment and fourth embodiment, it is possible to make an adjustment relating to a focusing position in assembly to be unnecessary, by controlling not only dimensions of the leg portion 1c' of the lens 1' closer to an image (including contact portion 1d') but also a distance between the lens 9 closer to a subject and the lens 1' closer to an image accurately. Incidentally, with regard to the distance between the lens 9 closer to a subject and the lens 1' closer to an image, fine correction for the distance can be made by changing a thickness of diaphragm plate 3.

Incidentally, independently of the embodiment stated above, lens 9 or 9' closer to a subject may also be a positive lens, a tele-converter or a wide-converter. When higher image quality is desired, a lens section may also be composed of three lenses or more. Further, when the lens section is constituted with a zoom lens composed of plural lens groups, a focal length may be made to be variable to cope with broader application for photographing.

Next, various embodiments of the elastic member will be explained.

Figure 14:
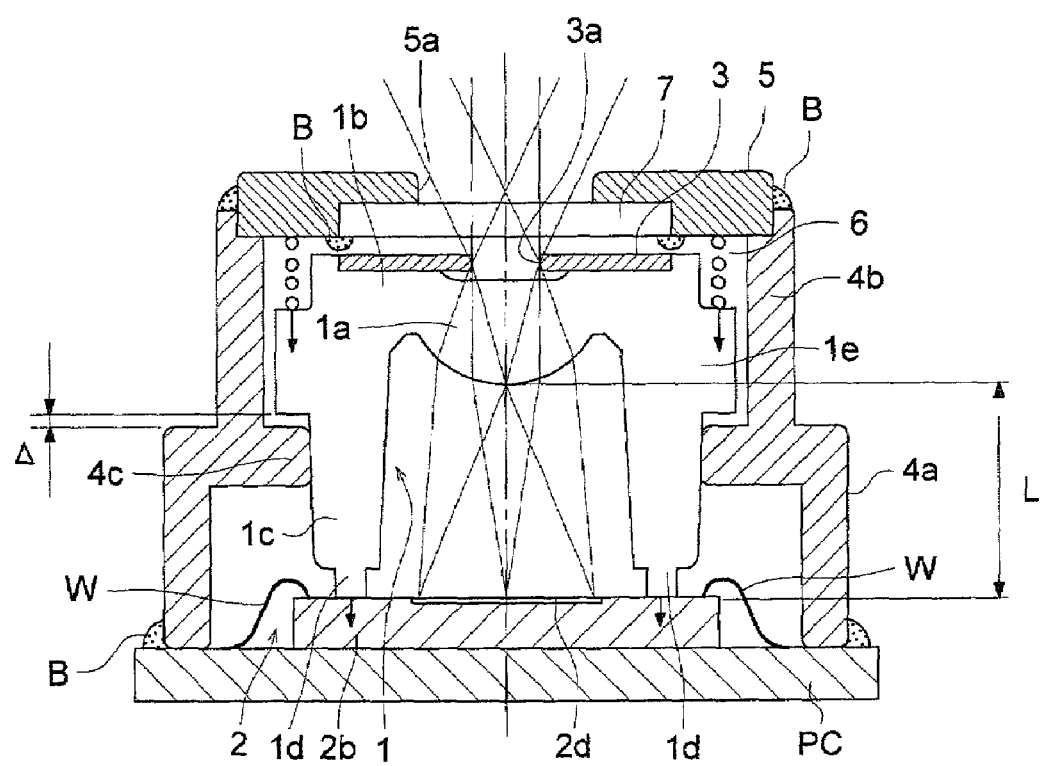
FIG. 14 is a sectional view of an image pickup device of the fifth embodiment.

In the fifth embodiment shown FIG. 14, the elastic member 6 made of a coil spring is arranged between the light-shielding plate 5 and step portion 1e of the optical member 1, and the elastic member 6 is subjected to elastic deformation when the light-shielding plate 5 is attached on the lens frame 4, and the elastic force generated from the elastic deformation presses the optical member 1 downward in FIG. 14. Therefore, the force from the light-shielding plate 5 is not transmitted directly to image pickup element 2b although it is transmitted to base board PC.

Further, touching point 1d of optical member 1 is in a shape shown in FIG. 4 mentioned above, and it is protruded from the lower end of leg portion 1c to constitute a part of the leg portion 1c. In the present embodiment, touching point 1d is arranged under the condition that the touching point 1d only is in contact with the inside of pad 2c at peripheral surface 2a of image pickup element 2b, as shown with dotted lines in FIG. 5. Therefore, with regard to the flatness of the surface, the bottom surface of the touching point 1d only has to be maintained within a prescribed range. The number of leg portions 1c (touching point 1d) is four, and the center of gravity of the optical member 1 comes to its center, therefore, when individual optical member 1 is placed on a flat surface, it can be said that a position and a shape which make an optical axis of lens section 1a to be perpendicular to the flat surface are provided. Therefore, even when a clearance exists between an inner peripheral surface of lens frame 4 and an outer peripheral surface of optical member 1, the optical axis crosses the photoelectrically-converting section 2d of image pickup element 2b at right angles when leg portion 1c is brought into contact with peripheral surface 2a of the image pickup element 2b, thus, it is possible to obtains images with high image quality. On the rear side of the peripheral surface 2a (bottom surface side in FIG. 1) in this case, there is provided an unillustrated circuit of an image pickup element (including a signal processing circuit), but processing by the circuit is not affected by the contact of the touching point 1d.

Now, let the touching position of touching point 1d be studied. For example, when an effective pixel area is made to be smaller slightly by the total pixel area, a corner section 2g in the surface of the photoelectrically-converting section 2d shown in FIG. 5 becomes an area which has no connection with image forming. In that case, therefore, even when the touching point 1d is made to touch an area of the corner 2g within the surface of the photoelectrically-converting section 2d, the risk for the image pickup power of image pickup element 2b to be affected is less. Incidentally, whichever of peripheral surface 2a or the surface of the photoelectrically-converting section 2d is touched, it is preferable that the load from touching point 1d is not more than 500 g (not more than 1000 g/mm$^2$ in terms of surface pressure). That is because of a risk that image pickup element 2b is damaged if this load (surface pressure) is exceeded. When a blurred image caused by vibrations is considered, however, the load from the touching point 1d that is 5 g or more is desirable. The load of this kind can be controlled appropriately, by selecting a wire diameter and the number of turns of coil spring 6 representing an elastic means, as described later.

In the present embodiment, there is formed clearance A between a bottom surface of step portion 1e of optical member1 and partition wall 4c of lower portion 4a of lens frame 4 under the condition that the touching point 1d is in contact with peripheral surface 2a of image pickup element 2b. Therefore, distance L between lens section 1a and the photoelectrically-converting section 2d of image pickup element 2b (namely, positioning in the optical axis direction) can be set accurately by a length of leg portion 1c. Though four touching points in four locations are provided in the present embodiment, the number of locations may be one location-three locations. Further, if the interference with pad 2c can be avoided, a ring-shaped contact section that is running along cylindrical leg portion 1c of optical member 1 will do.

Further, since there is provided elastic means 6 that presses step portion 1e of optical member 1 with a prescribed elastic force in the optical axis direction, it is possible to use elastic force of the elastic means 6 to press leg portion 1c (touching point 1d) with an appropriate touching force (force corresponding to the load from 5 g to 500 g stated above) to peripheral surface 2a of image pickup element 2b along the optical axis direction for lens frame 4, and therefore, the optical member 1 and the image pickup element 2b can be positioned easily in the direction of an optical axis, and yet, it is possible to urge the optical member 1 against the image pickup element 2b with a stable elastic force, even when deformation such as a warp of parts is caused by a change with age, and thereby, to restrain play of the optical member 1 in the case of occurrence of vibrations, and thus, no excessive stress is caused on peripheral surface 2a of the image pickup element 2b in which a circuit are arranged, when shocks are caused. Even when a great force such as an impact force is applied in the direction of an optical axis of lens frame 4, the force is not transmitted directly to the image pickup element 2b although it is transmitted through the lens frame 4 to base board PC, which is preferable from the viewpoint of protection of the image pickup element 2b. Incidentally, although urethane and sponge are considered as the elastic means 6, a spring made of metal which can display a stable elastic force for a long time is preferable.

Figure 15:
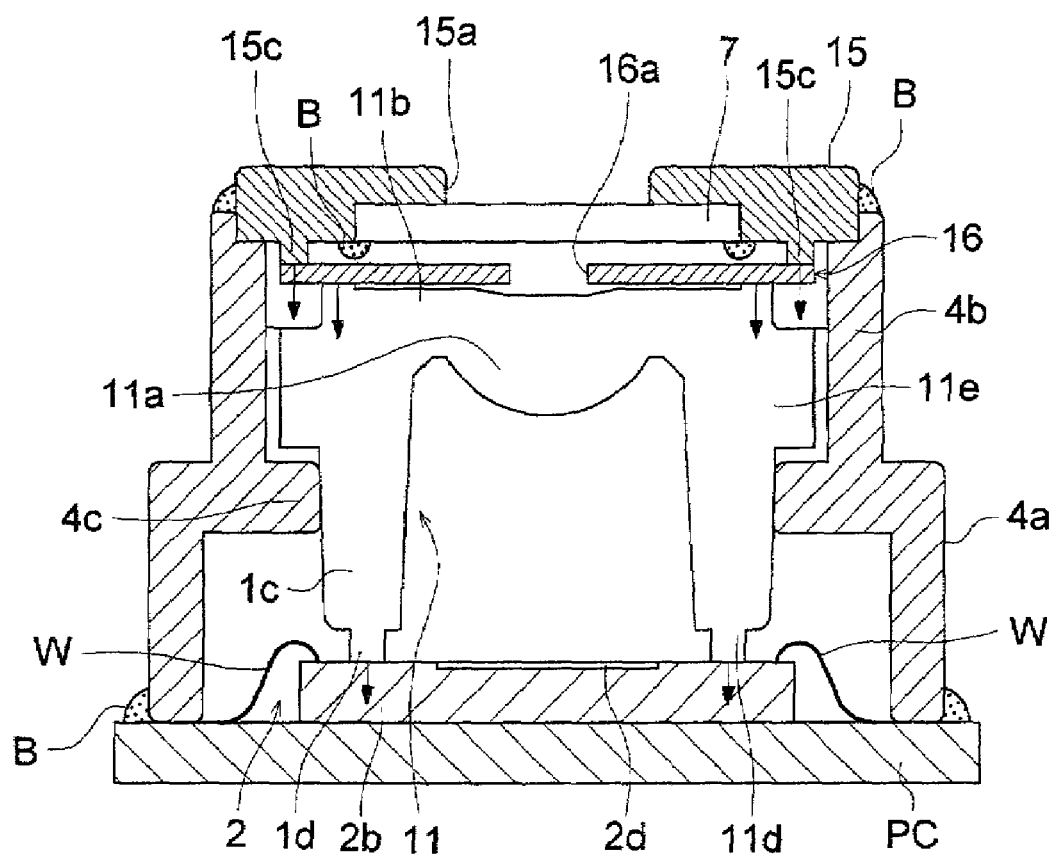
FIG. 15 is a sectional view of an image pickup device comprising a modified embodiment of the elastic means.
Figure 16:
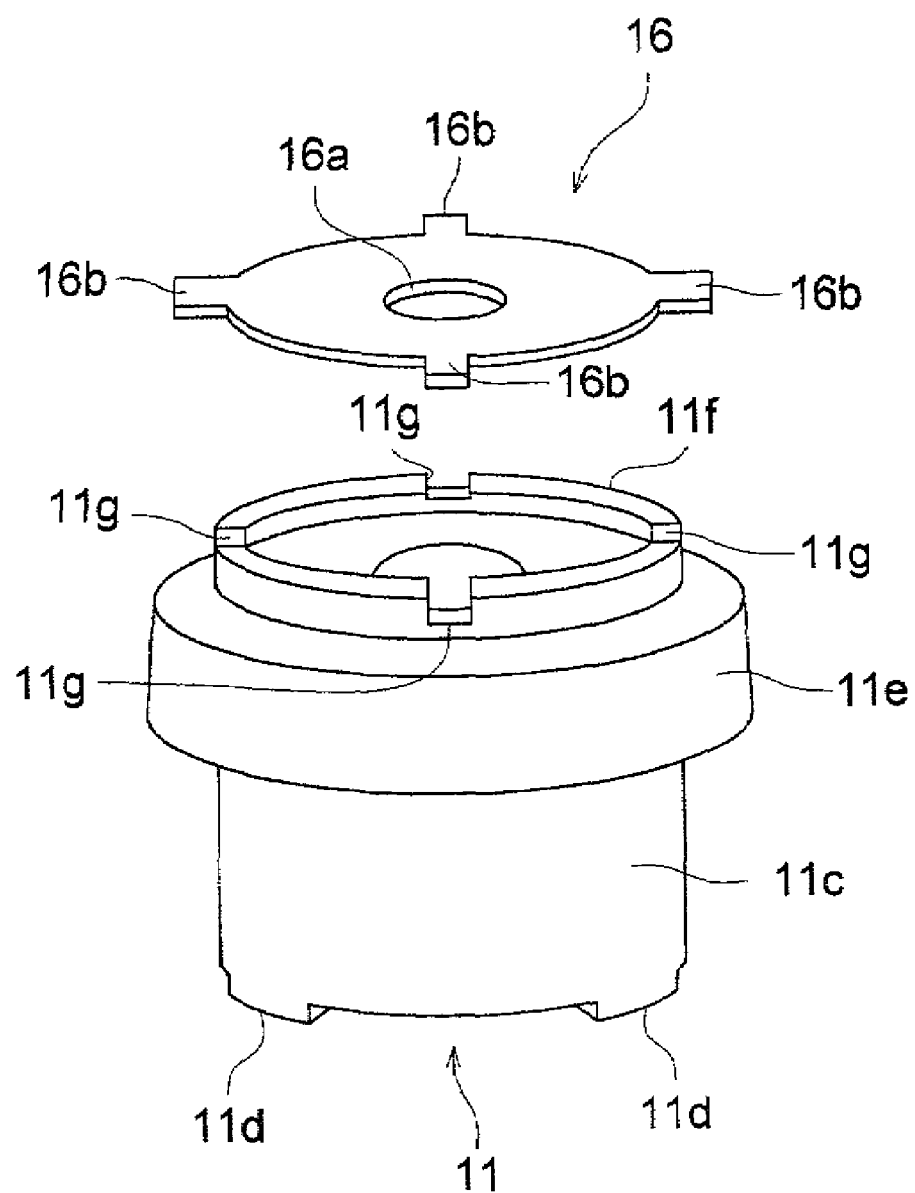
FIG. 16 is a perspective view showing an overhauling condition of the optical member and the elastic member.

FIG. 15 is a sectional view of an image pickup device including variations of an elastic means, and FIG. 16 is a perspective view showing an optical member and an elastic means which are disassembled. Elastic means 16 shown in FIG. 15 is made of a material having light-shielding characteristics, and it is arranged to display the function to stop down in place of diaphragm plate 3 shown in FIG. 14. To be more concrete, the elastic means 16 made of resin is a sheet-shaped member which is almost disc-shaped having aperture (diaphragm) 16a at the center, and four protrusions 16b are protruded toward the outside in the radial direction from the circumference of the elastic means 16 at regular intervals. On the other hand, on ring section 11f formed on the top of the optical member, there are formed cut-outs 11g each corresponding to each of the protrusions 16b. By making the cut-outs 11g to be engaged with the protrusions 16b, the elastic means 16 is mounted on the ring section 11f to be fitted therein. Further, in the case of mounting the light-shielding plate 15, when each protrusion 16b is pressed downward by protrusion 15c formed on the bottom surface of the light-shielding plate 15, the protrusion 16b is deformed elastically so that the optical member 11 may be urged against peripheral surface 2a of image pickup element 2b with the prescribed elastic force. Other structures are the same as those in the embodiment shown in FIG. 14, and explanation therefore will be omitted accordingly.

Figure 17:
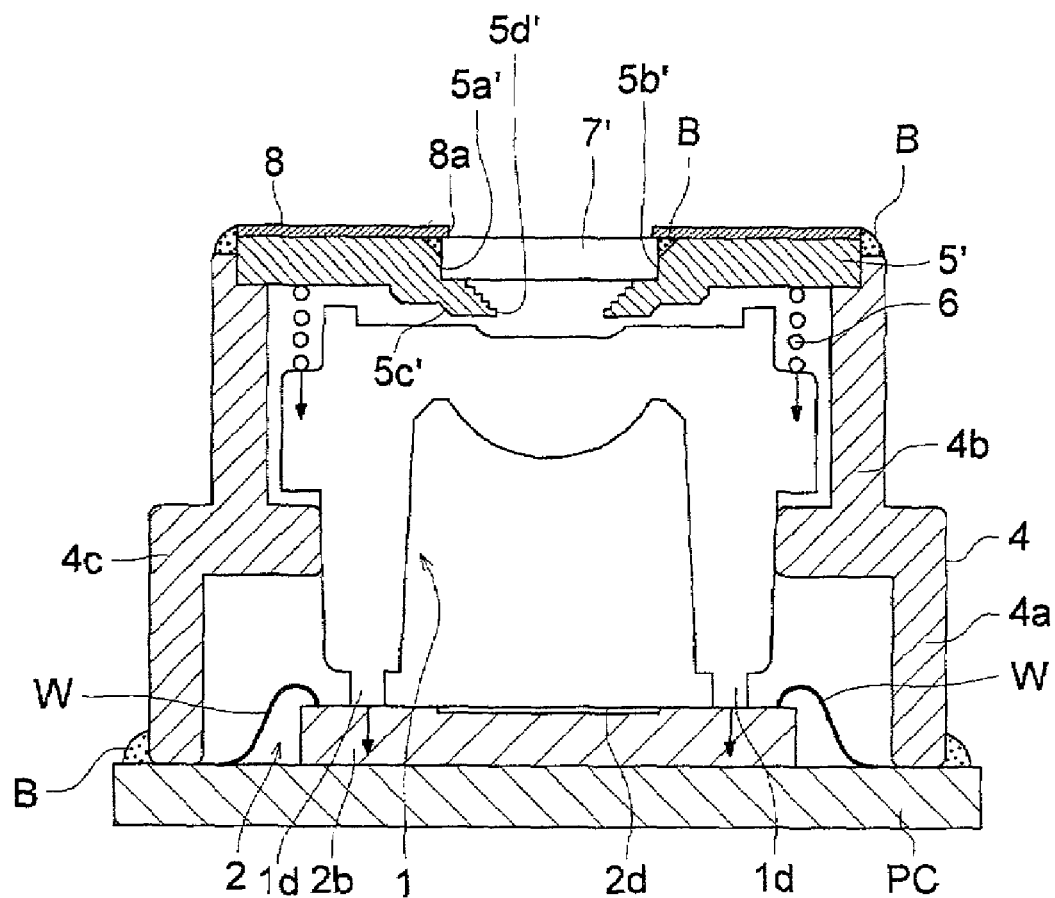
FIG. 17 is a sectional view of an image pickup device of the sixth embodiment.

FIG. 17 is a diagram showing an image pickup device relating to the sixth embodiment. In the sixth embodiment, only difference from the embodiment stated above is a change of the structure for a diaphragm plate and a light-shielding plate, and other structures which are the same as those in the aforesaid embodiment are given the same symbols, and explanation therefore will be omitted.

On top of upper portion 4b of lens frame 4, holding member 5', having on its upper surface, thin light-shielding sheet 8 is fixed with adhesives B, in FIG. 17. In aperture 5a' located at the center of the holding member 5' which is made of a material having light-shielding characteristics, there is fit filter 7' made of a material having infrared absorption characteristics. On an upper edge of the aperture 5a' of the holding member 5', there is formed tapered surface 5b', and the holding member 5' and the filter 7' are cemented each other by applying adhesive B on the tapered surface 5b'. Further, the holding member 5' is provided with tapered section 5c' which is protruded downward toward the lower portion of the aperture 5a' while its inside diameter is reduced stepwise, and its lowermost portion having the smallest inside diameter constitutes first diaphragm 5d'. Further, central aperture 8a of the light-shielding sheet 8 constitutes a second diaphragm. The holding member 5', filter 7' and light-shielding sheet 8 constitute a cover member.

Since a cover member composed of holding member 5', filter 7' and light-shielding sheet 8 is arranged to be closer to the subject side than lens section 1a of optical member 1, the lens section is not exposed and is protected, and sticking of foreign materials on the lens surface can also be avoided in the present embodiment. Further, since the cover member can be formed integrally, it contributes to reduction of the number of parts for the total image pickup device.

Since leg portion 1c of optical member 1 is arranged in the vicinity of the photoelectrically-converting section 2d of image pickup element 2b in the same way as in the aforesaid embodiment, there are fears that a light flux that does not contribute to image forming is reflected on the leg portion 1c and enters the photoelectrically-converting section 2d, causing a ghost image or flare. In the present embodiment, a second diaphragm (aperture 8a) that regulates a peripheral light flux is arranged to be closer to the object side than a first diaphragm 5a' that regulates F number of lens section 1a, and thereby entrance of unwanted light is reduced. Incidentally, further effect can be obtained by making aperture 8a of the second diaphragm to be a rectangle, because a field angle is different in each of the shorter side direction, the longer side direction and the diagonal direction of the photoelectrically-converting section 2d of image pickup element 2b.

Further, in the present embodiment again, there is provided elastic means 6 representing an urging member that presses step portion 1e of optical member 1 in the optical axis direction with a prescribed elastic force, and therefore, it is possible to stress leg portion 1c (touching point 1d) against peripheral surface 2a of image pickup element 2b with an appropriate touching force (aforesaid touching force ranging from 5 g to 500 g) in the direction of an optical axis for lens frame 4, by using an elastic force of the elastic means 6, thus, no excessive stress is caused on peripheral surface 2a of the image pickup element 2b in which a circuit is arranged, and no play of optical member 1 is caused by vibrations.

Figure 18:
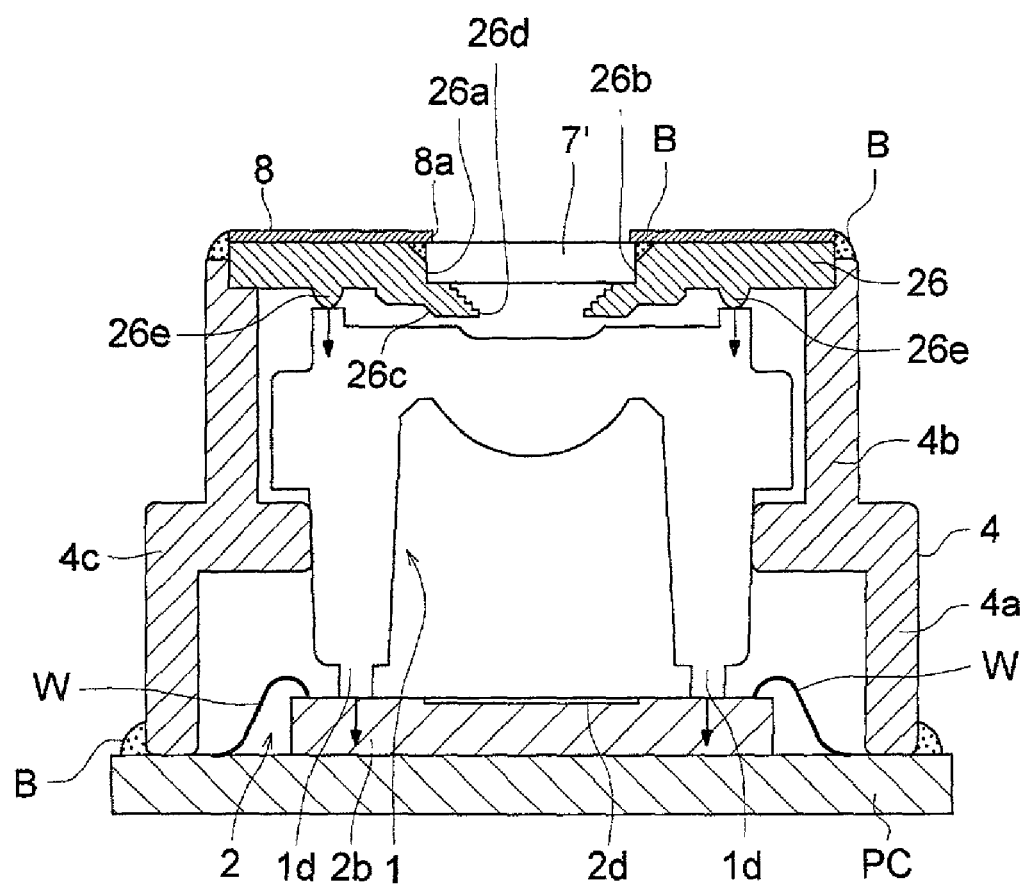
FIG. 18 is a sectional view of an image pickup device comprising an another modified embodiment of the elastic means.

FIG. 18 is a sectional view of an image pickup device including another variation of an elastic means. Elastic means 26 in FIG. 18 is united integrally with a holding member, namely, with a cover member. As is clear from FIG. 18, holding member 26 is made of resin material which is easily deformed elastically, such as elastomer resin, and four (two protrusions only are illustrated) protrusions (elastic means) 26e are formed on the bottom surface of the holding member 26 at regular intervals, which is only difference from holding member 5' in FIG. 17. When the holding member 26 is stuck (B) on lens frame 4, the protrusions 26e are deformed elastically, and thereby, optical member 1 is urged against peripheral surface 2a of image pickup element 2b with a prescribed elastic force. Other structures are the same as those in the embodiment shown in FIG. 17, and explanation therefore will be omitted accordingly.

Figure 19:
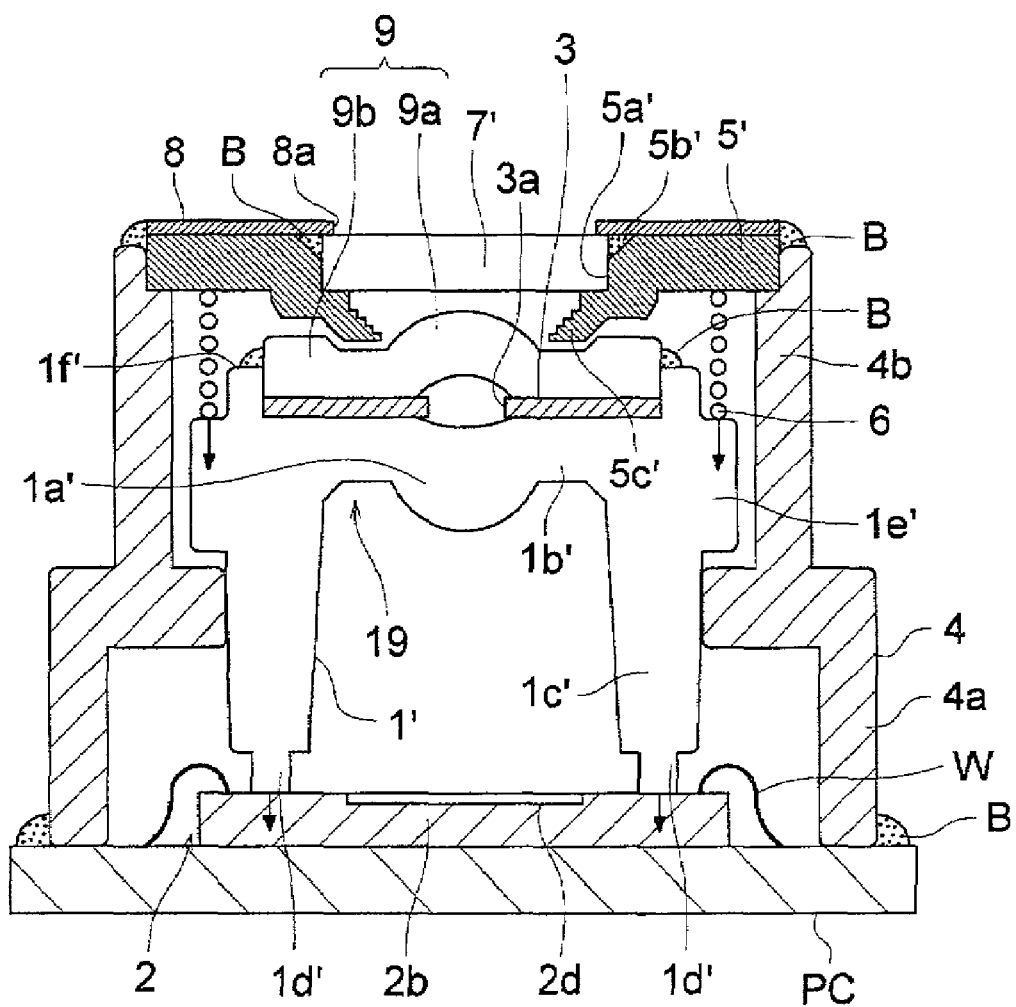
FIG. 19 is a sectional view of an image pickup device of the seventh embodiment.

FIG. 19 is a diagram showing an image pickup device relating to the seventh embodiment. In the seventh embodiment, only difference from the embodiment shown in FIG. 14 is that the structure of the optical member has been changed so that it has a plurality of lenses, and other same structures including the touching point between the leg portion and the image pickup element are given the same symbols, and explanation therefore will be omitted.

In FIG. 19, optical member 19 is composed of lens 1' closer to an image and lens 9 closer to a subject. Though the lens 1' closer to an image is in a form which is similar to that of the optical member shown in FIG. 14, a height in the optical axis direction of ring section 1f' formed on the upper portion of the lens 1' is greater than that in the optical member shown in FIG. 14. On upper surface 1b' that is inside the ring section 1f' in its radial direction, there is arranged the lens 9 closer to a subject through diaphragm plate 3 that stipulates the F number. The lens 9 closer to a subject is composed of flange section 9b that is fitted in an internal circumference of the ring section 1f' and of lens section 9a that is formed at the center. The lens section 9a of the lens 9 closer to a subject is a negative lens, while lens section 1a' of the lens 1' closer to an image is a positive lens. Incidentally, the diaphragm plate 3 in the present embodiment functions as a spacer that regulates a distance between lens sections 1a' and 9a, and aperture 3a of the diaphragm plate 3 functions as a first diaphragm that stipulates the F number.

Since an internal peripheral surface of the ring section 1f of the lens 1' closer to an image and an outer peripheral surface of the flange section 9b of the lens 9 closer to a subject are of the same diameter and are in parallel with an optical axis, it is possible to position the lens sections 1a' and 9a in the direction perpendicular to an optical axis when these internal peripheral surface and outer peripheral surface are engaged, and thereby to make their optical axes to be agreed easily. Incidentally, the lens 9 closer to a subject is cemented with the lens 1' closer to an image by adhesives B applied on the circumference of the lens 9.

Holding member 5' on top of which thin light-shielding sheet 8 is stuck is attached on the upper end of upper portion 4b of lens frame 4 by adhesives B. Filter 7' made of a material having light-shielding characteristics is arranged to be fitted in aperture 5a' located at the center of the holding member 5' that is made of a material having light-shielding characteristics. On an upper edge of the aperture 5a' of the holding member 5', there is formed tapered surface 5b', and it is possible to cement the filter 7' with the holding member 5' by applying adhesives B on the tapered surface. Further, the holding member 5' is provided with tapered section 5c' which is protruded downward toward the lower portion of the aperture 5a' while its inside diameter is reduced stepwise, and this portion functions as a light-shielding section that restrains entrance of unwanted light. Incidentally, the central aperture 8a on the light-shielding sheet 8 constitutes a second diaphragm.

Further, in the present embodiment again, there is provided elastic means 6 representing an urging member that presses step portion 1e' of optical member 19 in the optical axis direction with a prescribed elastic force, and therefore, it is possible to stress leg portion 1c' (touching point 1d') against peripheral surface 2a of image pickup element 2b with an appropriate touching force (aforesaid touching force ranging from 5 g to 500 g) in the direction of an optical axis for lens frame 4, by using an elastic force of the elastic means 6, thus, no excessive stress is caused on peripheral surface 2a of the image pickup element 2b in which a circuit is arranged, and no play of optical member 19 is caused by vibrations.

Figure 20:
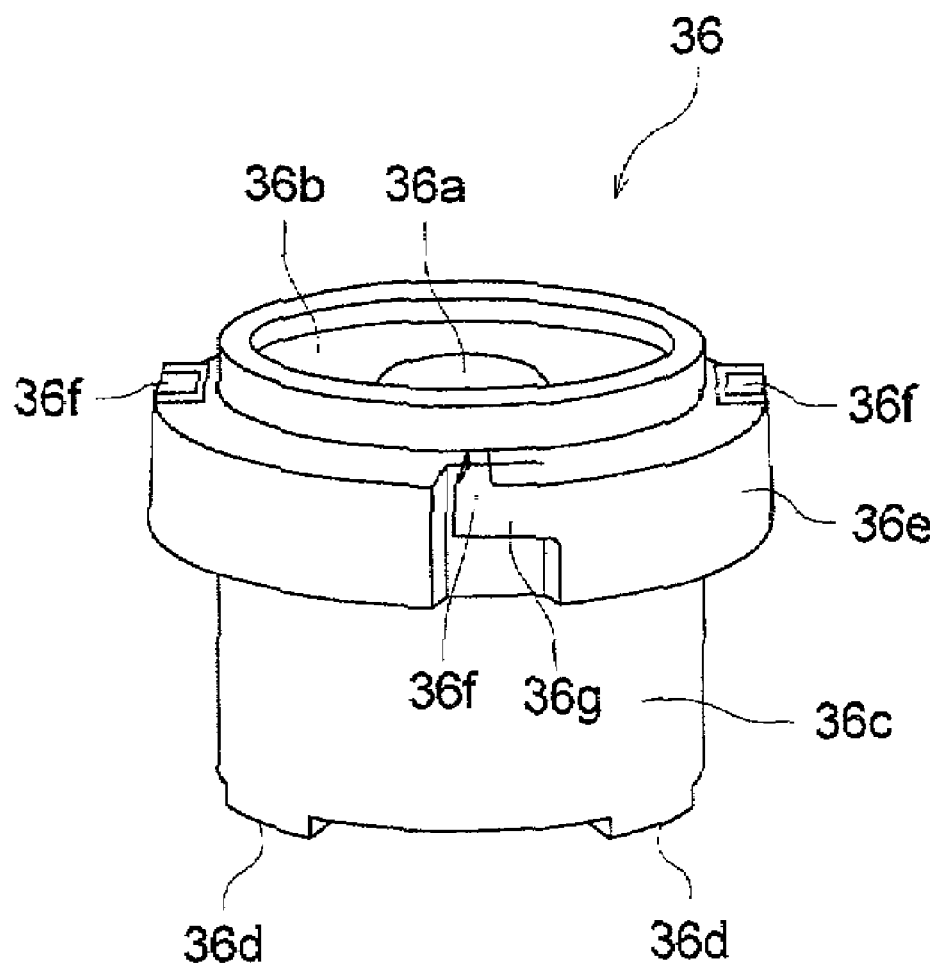
FIG. 20 is a perspective view showing an another modified embodiment.

FIG. 20 is a perspective view of another variation of an elastic means. Elastic means 36 in FIG. 20 is united integrally with an optical member, and it can be incorporated, for example, in the image pickup device in FIG. 14 from which elastic means 6 is eliminated. As is clear from FIG. 20, four protrusions (elastic means) 36f (three protrusions only are shown) and arm sections 36g supporting the protrusions are formed on step portion 36e of optical member 36, which is only difference from the optical member 1 in FIG. 14. As shown in FIG. 14, under the condition that optical member 36 is incorporated, protrusions 36g are brought into contact with a bottom surface of light-shielding plate 5 (FIG. 14), and thereby, cantilever arm 36g is deformed elastically, and an elastic force generated therefrom urges the optical member 1 against peripheral surface 2a of image pickup element 2b with a prescribed elastic force (FIG. 14). Other structures are the same as those in the embodiment shown in FIG. 14, and explanation therefor will be omitted accordingly.

Figure 21:
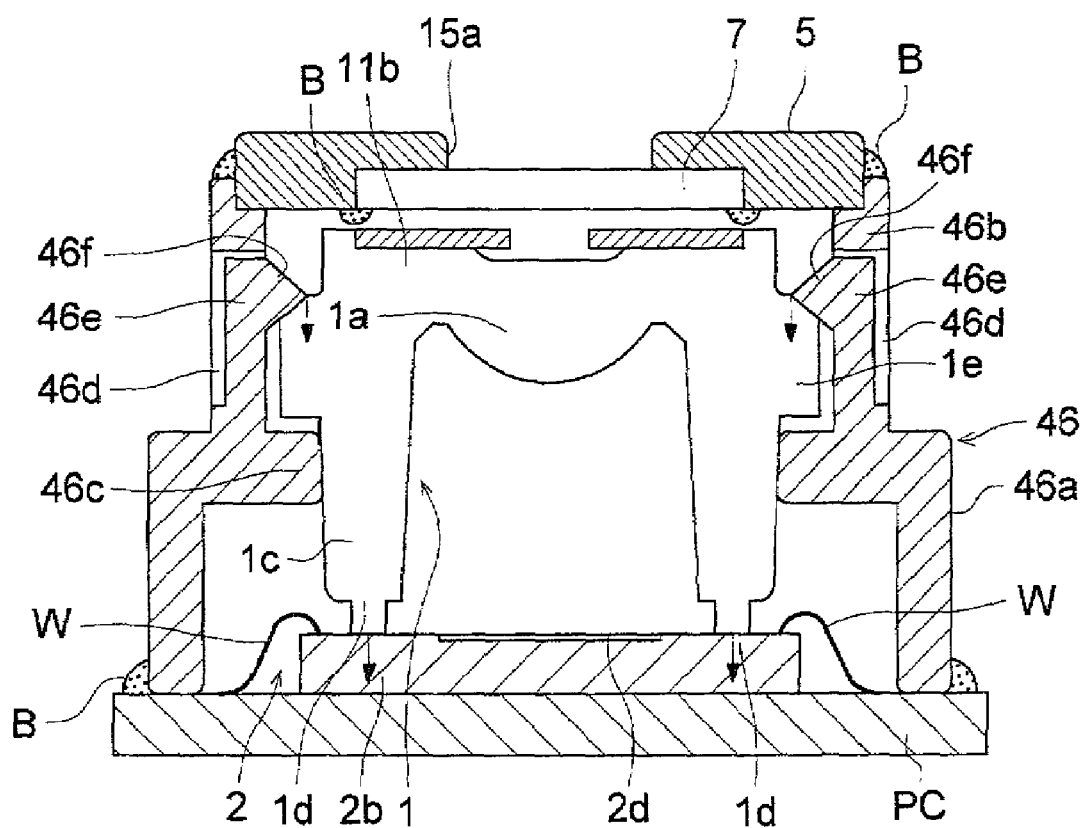
FIG. 21 is a sectional view of an image pickup device comprising the another modified embodiment.

FIG. 21 is a sectional view of an image pickup device including another variation of an elastic means. An elastic means in FIG. 21 is united integrally with a lens frame. As is clear from FIG. 21, four cut-outs 46d (two cut-outs only are shown) are formed on upper half section 46b of lens frame 46 at regular intervals, and lower end of arm 46e that extends to be in parallel with an optical axis is connected with a bottom edge of the cut-out 46e in FIG. 21. On the upper end of the arm 46e, there is formed protruded section 46f which is protruded in the direction perpendicular to the optical axis direction and has a section that is almost in a shape of a triangle. Incidentally, it is preferable that an upper portion of step portion 1e of the optical member 1 is in a tapered shape. The arm 46e and the protruded section 46f constitute an elastic means.

When inserting optical member 1 into lens frame 46 attached on base board PC from the upper side in FIG. 21, step portion 1e touches protruded section 46f, and the arm 46e is deformed elastically to be expanded outward to be perpendicular to an optical axis, which makes it easy to incorporate the optical member 1. On the other hand, when the optical member 1 is incorporated up to the position shown in FIG. 21, deformation of the arm 46e is restored. However, the shape of the protruded section 46f is determined so that the restoration mentioned above is not perfect and the deformation may remain slightly. Therefore, the elastic force resulted from the remained deformation makes the protruded section 46f to urge the step portion 1e in the arrowed direction, and thereby, the optical member 1 is urged against peripheral surface 2a of image pickup element 2b with a prescribed elastic force. Other structures are the same as those in the embodiment shown in FIG. 14, and explanation therefor will be omitted accordingly. Incidentally, in the present embodiment, sufficient function for dust-proof and moisture-proof cannot be displayed as it is, because of the structure to form the arm 46e and protruded section 46f. Contrary to this, it is possible to make the desired function for dust-proof and moisture-proof to work by covering a clearance of the elastic structure (46e and 46f) of lens frame 46 with a separate member.

As another example of the elastic means, a combination of a corrugated spring and a disc spring can be used in addition to the foregoing.

The invention has been explained above, referring to the embodiment to which, however, the invention is not limited, and modification and improvement for the invention can naturally by made. For example, though the connection between the image pickup element 2b and the base board PC is carried out by wire W in the present embodiment, it is also possible to consider the structure wherein wiring creeps inside image pickup element 2b and signals are taken out of the rear side (opposite to the photoelectrically-converting section) or the side of the image pickup element 2b. The structure of this kind makes it possible to secure a broad peripheral surface of the image pickup element and to wire easily. Further, though an image pickup unit is composed only of image pickup elements representing bare chips in the present embodiment, it is also possible to structure the image pickup unit of a solid type by gluing a sheet material such as glass on the upper surface or the bottom surface of the image pickup element. An image pickup device of the invention is considered to be capable of being incorporated in various items such as a cell phone, a personal computer, PDA, an AV apparatus, a TV set and a household electric appliance.

The present invention makes it possible to provide an image pickup device wherein cost is low, the number of parts can be reduced, a size is small, assembling is accurate despite no adjustment, and dust-proof and moisture-proof structures are provided.

What is claimed is:

1. An image pickup device mounted on a base board, comprising:
   an image pickup element including a plate mounted on a top surface of the base board, the plate having a thickness, a photoelectrically converting section provided on a top surface of the plate and having pickup elements, a peripheral top surface formed on the top surface of the plate around the photoelectrically converting section and a side surface of the plate adjoining the peripheral top surface;

an optical member including a lens section to form an image of an object on the photoelectrically converting section of the plate, a leg section to support the lens section and a contact surface provided at a lower end of the leg section, the contact surface resting on only the peripheral top surface of the plate such that the lower end of the leg section does not extend beyond the top surface of the plate; and a lens frame having a slidable contact surface at a lower end thereof and an inner space in which the optical member is accommodated so as to come in contact with an inner wall of the lens frame;

wherein the optical member is mounted on the image pickup element such that a first position between the lens section and the photoelectrically converting section of the image pickup element in an optical axis direction is determined by resting the contact surface of the optical member on only the peripheral top surface or with a top surface member when the top surface member is provided on the peripheral surface, and wherein the lens frame is mounted on the base board such that a second position between the lens section and the photoelectrically converting section of the image pickup element in a direction perpendicular to the optical axis is determined by bringing the slidable contact surface of the lens frame in direct contact with only the top surface of the base board and by positioning the slidable contact surface of the lens frame on the base board.

2. The image pickup device of claim 1, wherein a terminal to electrically connect the image pickup element with the base board is formed on the peripheral surface and the contact portions are located between the terminal and the photoelectrically converting section.

3. The image pickup device of claim 1, wherein the photoelectrically converting section is located at a central portion of the image pickup element.

4. The image pickup device of claim 1, wherein an image processing circuit is provided in an inner portion of the image pickup element at an inside of the peripheral surface.

5. The image pickup device of claim 1, further comprising an elastic member to press the lens section in the optical axis direction.

6. The image pickup device of claim 5, further comprising a cover member provided at the object side of the lens section to press the lens section with the aide of the elastic member, wherein the cover member includes a part capable of transmitting light.

7. The image pickup device of claim 6, wherein a part of the cover member is made of a material having an infrared ray absorbing characteristic.

8. The image pickup device of claim 1, wherein the optical member is adapted to be inserted into the lens frame from the object side.

9. The image pickup device of claim 1, further comprising a first diaphragm to regulate a F-number of the lens section and a second diaphragm located at the object side of the first diaphragm to regulate a peripheral light flux.

10. The image pickup device of claim 1, wherein the lens section comprises a first diaphragm to regulate a F-number of the lens section and is a positive single lens having a surface with a curvature stronger at an image side.

11. The image pickup device of claim 1, wherein the lens section comprises at least two lenses.

12. The image pickup device of claim 11, wherein the lens section comprises a positive lens and a negative lens.

13. The image pickup device of claim 11, wherein in the lens section, a lens located closest to the image side is a positive lens and a first diaphragm to regulate a F-number is arranged at the object side of the positive lens.

14. The image pickup device of claim 11, wherein the position of each of the at least two lenses in a direction perpendicular to the optical axis is set by engaging surfaces of the at least two lenses parallel to the optical axis in the lens section.

15. The image pickup device of claim 5, wherein the leg section is brought in contact with a surface of a part of the image pickup element with a weight of 5 g to 500 g on a condition that the image pickup element is positioned so as to face the lens section.

16. The image pickup device of claim 5, wherein the elastic member is constructed as a separate body from the optical member and the cover member.

17. The image pickup device of claim 5, wherein the elastic member is a coil spring.

18. The image pickup device of claim 5, wherein the elastic member is a sheet-shaped member having a opening at a central portion thereof.

19. The image pickup device of claim 18, wherein the sheet-shaped member is made of a material having a light shielding capability and additionally has a function of a diaphragm to regulate the F-number of the lens section.

20. The image pickup device of claim 6, wherein the elastic member is made in a single body with the cover member.

21. The image pickup device of claim 5, wherein the elastic member is made in a single body with the optical member.

22. The image pickup device of claim 1, wherein the lens frame is fixed to the base board with adhesive.

* * * * *